(12) United States Patent
Tanaka et al.

(10) Patent No.: US 8,268,402 B2
(45) Date of Patent: Sep. 18, 2012

(54) FULLERENE FILM AND FULLERENE POLYMER BOTH PRODUCED FROM FULLERENE DERIVATIVE AND PROCESSES FOR PRODUCING THESE

(75) Inventors: Katsutomo Tanaka, Fukuoka (JP); Masatoshi Takagi, Kanagawa (JP)

(73) Assignees: Frontier Carbon Corporation, Kitakyusyu-shi (JP); Mitsubishi Chemical Corporation, Tokyo (JP)

( * ) Notice: Subject to any disclaimer, the term of this patent is extended or adjusted under 35 U.S.C. 154(b) by 272 days.

(21) Appl. No.: 12/521,630

(22) PCT Filed: Dec. 26, 2007

(86) PCT No.: PCT/JP2007/075036
§ 371 (c)(1),
(2), (4) Date: Dec. 1, 2009

(87) PCT Pub. No.: WO2008/081845
PCT Pub. Date: Jul. 10, 2008

(65) Prior Publication Data
US 2010/0317767 A1    Dec. 16, 2010

(30) Foreign Application Priority Data

Dec. 27, 2006   (JP) .............................. P. 2006-351751

(51) Int. Cl.
*B05D 3/02* (2006.01)
*B32B 9/00* (2006.01)
(52) U.S. Cl. .................... 427/384; 427/372.2; 428/408; 977/900
(58) Field of Classification Search .................. None
See application file for complete search history.

(56) References Cited

U.S. PATENT DOCUMENTS

2007/0215872 A1 *  9/2007  Chikamatsu et al. ........... 257/40

FOREIGN PATENT DOCUMENTS

| JP | 7 62105 | 3/1995 |
|---|---|---|
| JP | 2004 14120 | 1/2004 |
| JP | 2005 139035 | 6/2005 |
| JP | 2005 186429 | 7/2005 |
| JP | 2006 227391 | 8/2006 |
| JP | 2006290788 A * | 10/2006 |
| JP | 2006 306010 | 11/2006 |
| JP | 2006 344794 | 12/2006 |
| JP | 2008 164806 | 7/2008 |
| WO | 2008 062888 | 5/2008 |

OTHER PUBLICATIONS

Machine translation of JP 2006290788 A, provided by the JPO website (no date).*
Shi, S. et al., "A Polyester and Polyurethane of Diphenyl $C_{61}$: Retention of Fulleroid Properties in a Polymer", J. Am. Chem. Soc., vol. 114, pp. 10656-10657, (1992).
Janaki, J. et al., "Thermal stability of a fullerene-amine adduct", Thermochimica Acta, Elsevier, vol. 356, pp. 109-116, (2000).

* cited by examiner

*Primary Examiner* — Michael J Feely
(74) *Attorney, Agent, or Firm* — Oblon, Spivak, McClelland, Maier & Neustadt, L.L.P.

(57) ABSTRACT

Disclosed is a fullerene film which can be easily formed by a wet process without deteriorating the intrinsic properties of a fullerene by using a fullerene derivative as a raw material. Also disclosed are a fullerene polymer, a method for producing a fullerene film, and a method for producing a fullerene polymer. A fullerene film or a fullerene polymer maintaining the intrinsic properties of the fullerene is obtained by coating a base with a solution of a fullerene derivative and then heating the thus-obtained coating film at a temperature higher than the thermal decomposition temperature of the fullerene derivative but lower than the thermal decomposition temperature of the fullerene.

18 Claims, 3 Drawing Sheets

[Fig. 1]
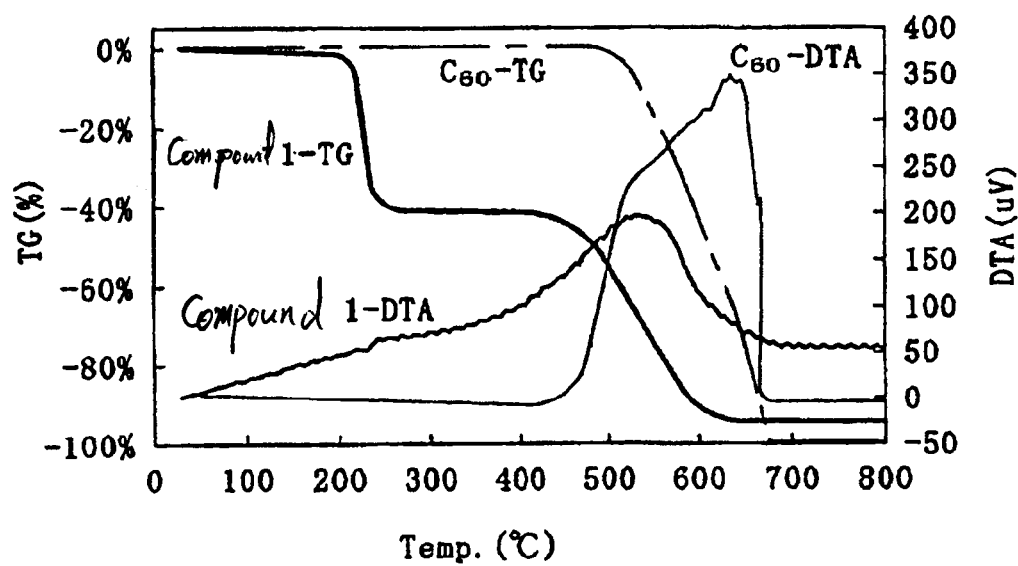

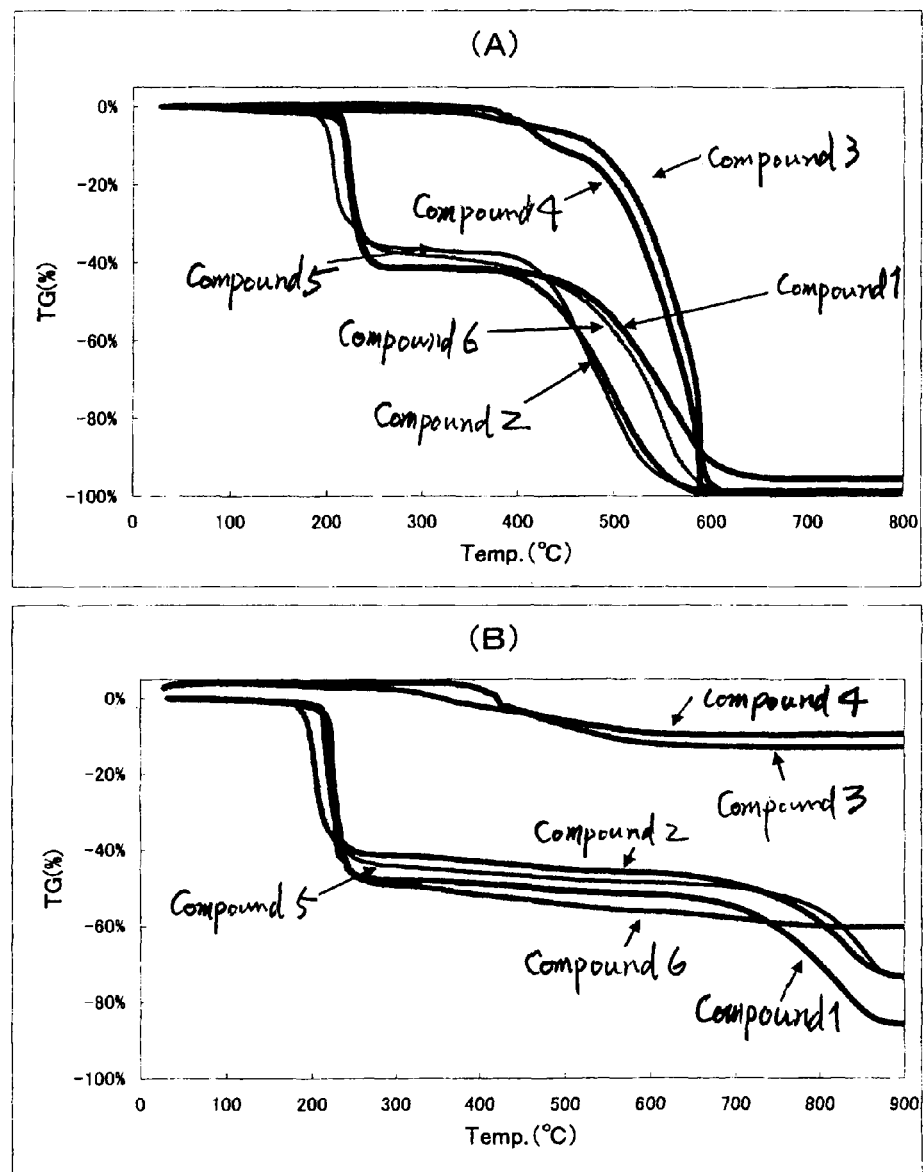
[Fig. 2]

[Fig. 3]
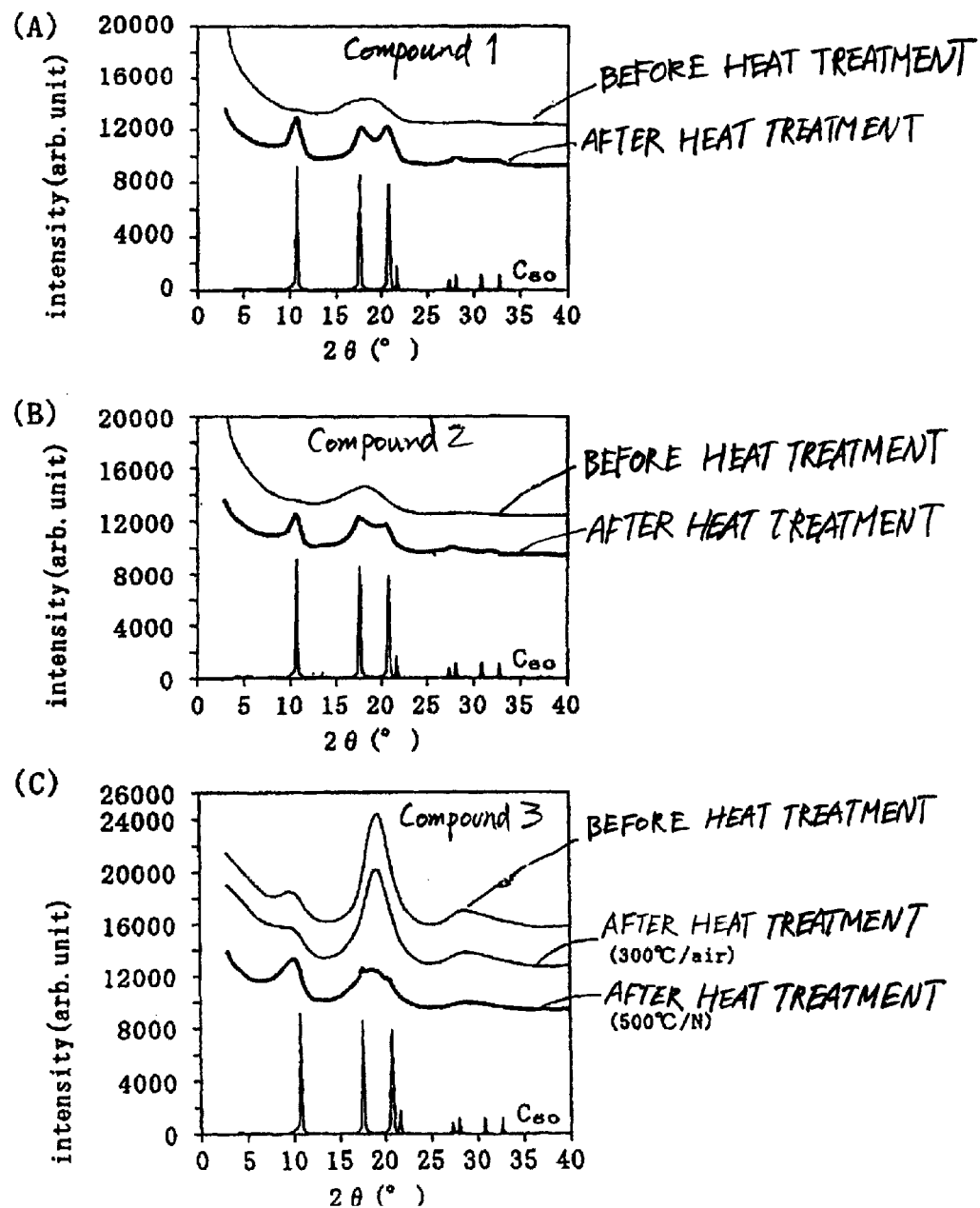

FULLERENE FILM AND FULLERENE POLYMER BOTH PRODUCED FROM FULLERENE DERIVATIVE AND PROCESSES FOR PRODUCING THESE

TECHNICAL FIELD

The present invention relates to a fullerene film, a fullerene polymer, and processes for producing these. More particularly, the invention relates to a fullerene film and a fullerene polymer which are produced from a fullerene derivative and which can be easily formed by a simple method such as a wet process and can retain the intact properties inherent in the fullerene, and to processes for producing the film and polymer.

BACKGROUND ART

Carbonaceous materials have been utilized from long ago as bulk materials such as diamond and graphite. In recent years, however, carbonaceous materials are coming to attract attention also as a coating material and a functional thin-film material. Of these materials, thin films of amorphous carbon represented by diamond-like carbon (DLC) have a low coefficient of friction and are excellent in smoothness and wearing resistance and, hence, are used in applications such as protective films for aluminum-processing molds, tools, etc., protective films for optical elements, and coating of the sliding surfaces of magnetic heads. For forming such amorphous-carbon thin films, vapor-phase growth methods such as the high-frequency plasma method and the ionization vapor deposition method are mainly used. However, all of these techniques necessitate a large vacuum apparatus and, hence, are high in film formation cost. In addition, those techniques are unsuitable for the formation of a film having a large area.

Among the carbonaceous materials which are attracting attention in recent years are fullerenes. Fullerene is a general term for carbon molecules having a spherical closed-shell structure. Fullerenes have unique properties attributable to the molecular structure, such as ultraviolet-absorbing properties, photoconductivity, and photosensitizing properties, and are hence expected to be used in a wide range of applications including electronic materials, e.g., organic semiconductors, functional optical materials, and coating materials as a substitute for conventional amorphous-carbon thin films. Investigations on the formation of a thin fullerene film on a substrate are being made enthusiastically in recent years.

It is known that the thermal conductivity of fullerenes is about one-hundredth the thermal conductivity of graphite (Hisanori Shinohara and Yahachi Saito, Furāren No Kagaku To Butsuri). Fullerene films are expected to be utilized as a heat-protective film more suitable than ordinary carbon films.

Furthermore, fullerenes have an exceedingly low electrical conductivity and are hence expected to be utilized as an insulating film or as a high-resistance black matrix for color filters.

Fullerenes further have excellent properties when used as organic n-type semiconductor molecules. Fullerenes are hence expected to be utilized as an organic-semiconductor thin film.

It is extremely difficult to form a thin fullerene film by a vapor-phase growth method. Because of this, investigations on the formation of a thin fullerene film by a wet process, e.g., the solvent casting method, have been made (see, for example, non-patent document 1). However, fullerenes have low solubility in solvents and show a reduced tendency to be oriented because of the highly symmetrical spherical molecular structure thereof. It has therefore been difficult to obtain by a wet process, e.g., the solvent casting method, a film which has a sufficient film thickness and in which the fullerene molecules have been regularly oriented.

On the other hand, in order to improve the film-forming properties and solvent solubility of fullerenes, various fullerene derivatives are being investigated and various derivatives have been proposed (see, for example, patent document 1). Methods of forming a film from a fullerene derivative also are being investigated. For example, non-patent document 2 discloses a technique in which a chemically modified fullerene derivative is used to form an LB film or self-assembled monolayer (SAM) on an electroconductive substrate. Furthermore, patent document 2 discloses a structure including a substrate and, formed thereon, a layer of a fullerene derivative having a structure constituted of a fullerene and a liquid-crystalline functional group bonded thereto.

Patent Document 1: JP-A-2006-199674

Patent Document 2: JP-A-2003-238490

Non-Patent Document 1: Pavel Janda et al., *Advanced Materials*, Wiley VCH Verlag (Germany), December 1998, Vol. 10, No. 17, pp. 1434-1438

Non-Patent Document 2: Hiroshi Imahori et al., *Journal of Physical Chemistry B*, American Chemical Society, U.S.A., Aug. 10, 1999, Vol. 103, No. 34, pp. 7233-7237

DISCLOSURE OF THE INVENTION

Problem that the Invention is to Solve

Attempts are also being made to improve solubility by introducing a substituent to a fullerene through an addition reaction. However, the introduction of a functional group onto a carbon atom of a fullerene through an addition reaction undesirably results in a change in the conjugation pattern of n-electrons and this may result in difficulties in obtaining a thin-film material while maintaining the properties inherent in the fullerene. For example, in non-patent document 3, there is a statement to the effect that when a fullerene derivative which is a di-adduct obtained by introducing two units of a functional group per fullerene molecule is used in an organic thin-film solar cell, then the photo-electric converting ability is completely lost. The explanation given therein is that the di-adduct has undergone a larger deformation of the fullerene framework than mono-adducts and hence has too high an LUMO energy level to receive electrons from a donor. As described above, no technique has been found so far which is for forming a fullerene film retaining the properties inherent in the fullerene by a simple method such as, e.g., a wet process. Non-Patent Document 3: Taiyō Enerugī, 30(1), 17-20, (2004)

The invention has been achieved under such circumstances. An object of the invention is to provide a fullerene film and a fullerene polymer which are produced from a fullerene derivative and which can be easily produced by a wet process, can be mass-produced, and can retain the intact properties inherent in the fullerene. Another object is to provide processes for producing the film and polymer.

Means for Solving the Problem

The present inventors diligently made investigations in order to overcome the problem described above. As a result, the inventors have found that a fullerene film made of a polymer of a fullerene is obtained by applying a solution of a fullerene derivative having specific properties and then pyrolyzing the derivative. Namely, an essential feature of the invention resides in a process for producing a fullerene film constituted of a fullerene polymer obtained by pyrolyzing a solution of a fullerene derivative having specific properties.

The invention has been achieved based on that finding. Essential points thereof are as follows.

[1] A fullerene film obtained by a pyrolysis of a fullerene derivative.

[2] A fullerene film obtained by applying to a substrate a solution of a fullerene derivative pyrolyzed at a temperature lower than a pyrolysis temperature of a fullerene to thereby obtain a coating film, and heating the coating film at a temperature which is higher than a pyrolysis temperature of the fullerene derivative and is lower than the pyrolysis temperature of the fullerene to thereby pyrolyze at least part of the fullerene derivative.

[3] The fullerene film according to [1] or [2] above, wherein the fullerene derivative includes a fullerene derivative which, when pyrolyzed to form a fullerene film, has a weight loss upon the pyrolysis of 5% by weight or more based on the weight of the fullerene derivative before the pyrolysis.

[4] The fullerene film according to any one of [1] to [3] above, wherein the fullerene derivative is a derivative of [60]fullerene. Preferably, the fullerene is [60]fullerene.

[5] The fullerene film according to any one of [1] to [3] above, wherein the fullerene derivative is a derivative of a fullerene mixture. Preferably, the fullerene is a fullerene mixture.

[6] The fullerene film according to any one of [1] to [5] above, wherein the fullerene derivative has a pyrolysis temperature of from 100° C. to 500° C.

[7] The fullerene film according to any one of [1] to [6] above, wherein the fullerene derivative has either of partial structures respectively represented by the following general formulae (1) and (2) on a fullerene framework.

[Ka-1]

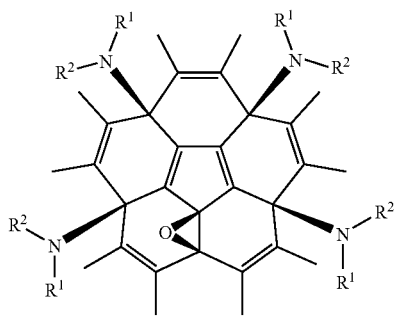

(1)

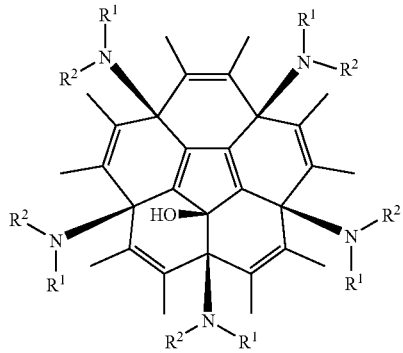

(2)

In general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

[8] The fullerene film according to any one of [1] to [6] above, wherein the fullerene derivative is a mixture of a fullerene derivative having a partial structure represented by the following general formula (1) on a fullerene framework and a fullerene derivative having a partial structure represented by the following general formula (2) on a fullerene framework.

[Ka-2]

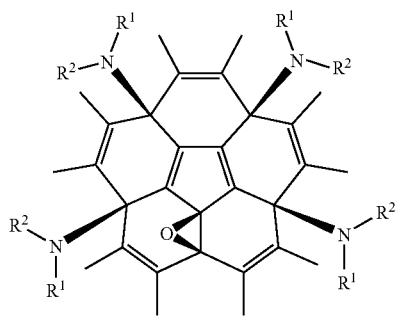

(1)

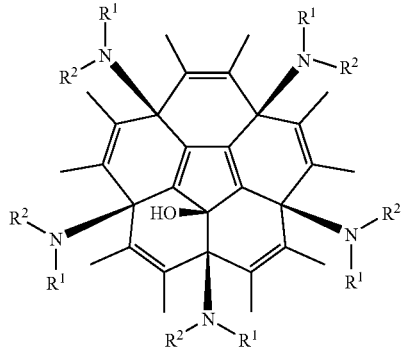

(2)

In general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

[9] The fullerene film according to any one of [1] to [8] above, which comprises a fullerene polymer.
[10] A process for producing a fullerene film, which comprises pyrolyzing a fullerene derivative.
[11] A process for producing a fullerene film, which comprises: a first step of applying to a substrate a solution of a fullerene derivative pyrolyzed at a temperature lower than a pyrolysis temperature of a fullerene to obtain a coating film; and a second step of heating the coating film obtained in the first step at a temperature which is higher than a pyrolysis temperature of the fullerene derivative and is lower than the pyrolysis temperature of the fullerene to thereby pyrolyze at least part of the fullerene derivative.
[12] The process for producing a fullerene film according to [10] or [11] above, wherein the fullerene derivative includes a fullerene derivative which, when pyrolyzed to form a fullerene film, has a weight loss upon the pyrolysis of 5% by weight or more based on the weight of the fullerene derivative before the pyrolysis.
[13] The process for producing a fullerene film according to [11] or [12] above, wherein the fullerene is [60]fullerene and the fullerene derivative is a derivative of [60]fullerene.
[14] The process for producing a fullerene film according to [11] or [12] above, wherein the fullerene is a fullerene mixture and the fullerene derivative is a derivative of a fullerene mixture.
[15] The process for producing a fullerene film according to any one of [11] to [14] above, wherein the fullerene derivative has a pyrolysis temperature of from 100° C. to 500° C. and the heating temperature in the second step is lower than 500° C.
[16] The process for producing a fullerene film according to any one of [10] to [15] above, wherein the fullerene derivative has either of partial structures respectively represented by the following general formulae (1) and (2) on a fullerene framework.

[Ka-3]

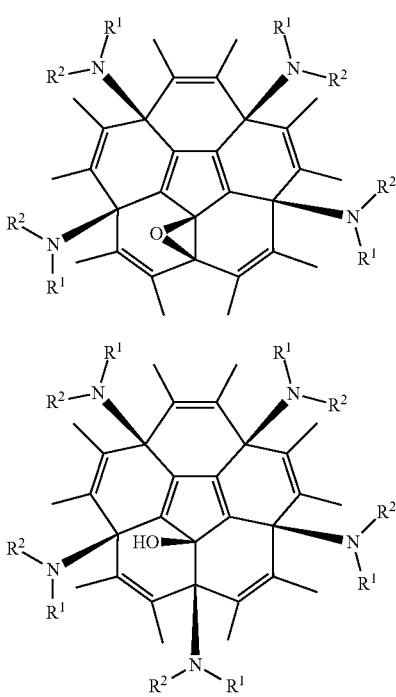

In general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

[17] The process for producing a fullerene film according to any one of [10] to [15] above, wherein the fullerene derivative includes a mixture of a fullerene derivative having a partial structure represented by the general formula (1) on a fullerene framework and a fullerene derivative having a partial structure represented by the general formula (2) on a fullerene framework.

[Ka-4]

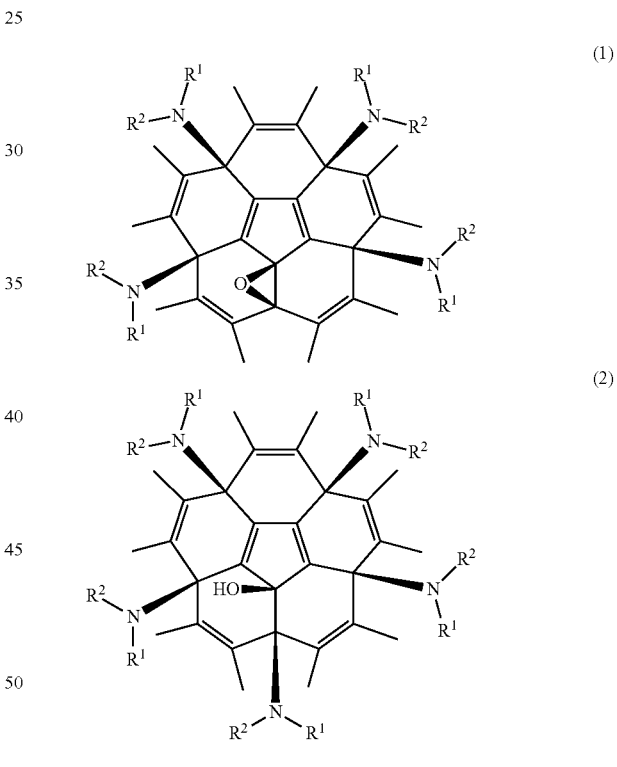

In general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

[18] A process for producing a fullerene polymer, which comprises pyrolyzing a fullerene derivative having either of partial structures respectively represented by the following general formulae (1) and (2) on a fullerene framework, at a temperature which is higher than a pyrolysis temperature of the fullerene derivative and is lower than a pyrolysis temperature of a fullerene.

[Ka-5]

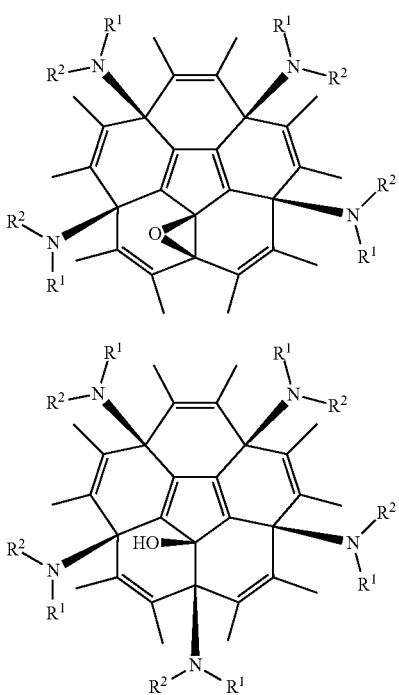

(1)

(2)

In general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

[19] A fullerene polymer film which is formed by the fullerene polymer.

[20] The process for producing a fullerene polymer according to [18] above, wherein the fullerene derivative has a pyrolysis temperature of from 100° C. to 500° C. and the heating temperature in the pyrolysis is lower than 500° C.

[21] A process for producing a fullerene polymer film, which comprises pyrolyzing a fullerene derivative having either of partial structures respectively represented by the following general formulae (1) and (2) on a fullerene framework, at a temperature which is higher than a pyrolysis temperature of the fullerene derivative and is lower than a pyrolysis temperature of a fullerene to thereby obtain the polymer film.

[Ka-6]

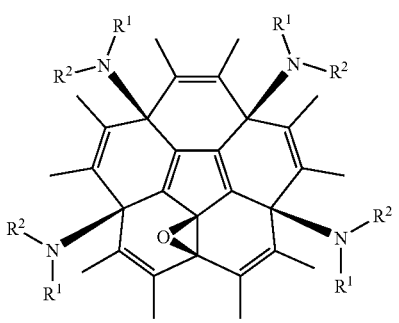

(1)

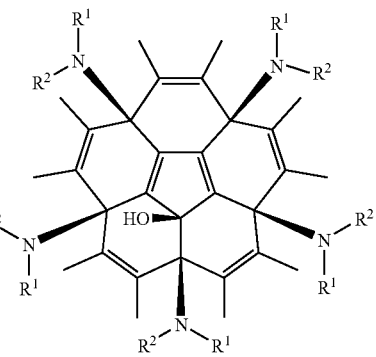

(2)

In general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

[22] The process for producing a fullerene polymer film according to [21] above, wherein the fullerene derivative has a pyrolysis temperature of from 100° C. to 500° C. and the heating temperature in the pyrolysis is lower than 500° C.

[23] A fullerene polymer comprising at least either of a nitrogen atom and an oxygen atom in the structure thereof.

[24] The fullerene polymer according to [23] above, wherein the content of the at least either of a nitrogen atom and an oxygen atom in the fullerene polymer is 0.1% by weight or higher.

[25] The fullerene polymer according to [23] or [24] above, which is obtained by the pyrolysis of fullerene derivative having partial structures represented by general formulae (1) and (2) above on a fullerene framework.

[26] An n-type semiconductor which comprises the fullerene polymer according to any one of [23] to [25] above.

[27] An organic solar cell which comprises the fullerene polymer according to any one of [23] to [25] above.

Advantages of the Invention

According to the invention, a fullerene film can be obtained from a pyrolyzable fullerene derivative, for example, by heating and decomposing a coating film obtained by a simple method such as, e.g., a wet process. Because of this, a fullerene film having a larger thickness and a larger area than fullerene films produced by vapor-phase growth methods including vapor deposition is easily obtained. Furthermore, by using a fullerene derivative having a decomposition temperature lower than the decomposition temperature of the fullerene, the closed-shell structure of the fullerene is inhibited from being destroyed by the heating in fullerene film formation. Consequently, a fullerene film having a high fullerene structure content and retaining the intact properties of the fullerene can be obtained. In addition, for producing the fullerene film of the invention, no expensive apparatus such as vapor deposition apparatus are necessary. The fullerene film can be produced by a wet process by utilizing properties of the fullerene derivative itself. Because of this, the fullerene film can be easily produced at low cost. Namely, according to the invention, a fullerene film can be easily and highly efficiently produced at low cost.

The fullerene film obtained by the invention is suitable for use in various fields while taking advantage of the low thermal conductivity and low electrical conductivity of the fullerene.

For example, the fullerene film can be used as functional thin films such as organic-semiconductor thin films and photoconductive films, thin films for batteries, and lubricating films for sliding surfaces.

BRIEF DESCRIPTION OF THE DRAWINGS

FIG. 1 is a graphic presentation showing the results of a TG-DTA examination of [60]fullerene and Compound 1, which is an aminated [60]fullerene derivative.

FIG. 2(A) is a graphic presentation showing the results of a TG examination of Compounds 1 to 6 in air. FIG. 2(B) is a graphic presentation showing the results of a TG examination of Compounds 1 to 6 in nitrogen.

FIGS. 3(A), (B), and (C) are graphic presentations showing the results of an examination by X-ray diffractometry of coating films of Compounds 1, 2, and 3, respectively, the examination having been made before and after a heat treatment.

BEST MODE FOR CARRYING OUT THE INVENTION

The fullerene film according to one embodiment of the invention, the fullerene polymer, and the processes for producing the film and polymer are explained below in detail. However, the invention should not be construed as being limited to the following explanation, and any desired modifications of the invention can be made unless the modifications depart from the spirit of the invention.

(1) Fullerenes and Analogues:

A fullerene is a carbon cluster constituted of carbon atoms having a hollow closed-shell structure. The number of these carbon atoms constituting the closed-shell structure generally is an even number of 60-130. Examples of the fullerene include $C_{60}$, $C_{70}$, $C_{76}$, $C_{78}$, $C_{82}$, $C_{84}$, $C_{90}$, $C_{94}$, and $C_{96}$ and further include higher-order carbon clusters having a larger number of carbon atoms than these. For producing a fullerene film, use can be suitably made of each of those fullerenes and a fullerene mixture composed of two or more of those fullerenes. The number of carbon atoms therein is not particularly limited. However, it is preferred to use a fullerene mixture or $C_{60}$ from the standpoints of easy production, etc.

The term "fullerenes and analogues" means a conception widely including not only fullerenes but fullerene derivatives. The "framework" of a fullerene means the carbon framework constituting the closed-shell structure of a fullerene or fullerene analogue.

"Fullerene derivative" is a general term for compounds or compositions obtained by combining one or more organic or inorganic groups of atoms to one or more of the carbon atoms of a fullerene. For example, that term widely means not only ones having a structure constituted of a fullerene framework and a given substituent added thereto but also ones including fullerene/metal complexes containing a metal or a molecule inside.

Specific examples thereof include fullerene hydrides, fullerene oxides, fullerene hydroxides, aminated fullerenes, sulfurized fullerenes, halogenated (F, Cl, Br, or I) fullerenes, fulleroids, methanofullerenes, pyrrolidinofullerenes, alkylated fullerenes, and arylated fullerenes. In each of these fullerene derivatives, the fullerene framework may have one substituent added thereto, or may have two or more substituents added thereto. Substituents of two or more different kinds may have been added to the fullerene framework. Preferred of those fullerene derivatives are aminated fullerenes. One fullerene derivative may be used alone, or two or more fullerene derivatives may be used in combination.

Of these, $C_{60}$ or $C_{70}$ derivatives are preferred because these derivatives are major products in fullerene production and are easily available. More preferred is a derivative of a mixture of these or a derivative of $C_{60}$. Namely, ones in which the fullerene framework is $C_{60}$ or $C_{70}$ are preferred, and one in which the fullerene framework is a mixture of $C_{60}$ and $C_{70}$ or is $C_{60}$ is more preferred.

Incidentally, a fullerene in which the number of carbon atoms is X is hereinafter referred to as "[X]fullerene". For example, fullerene $C_{60}$ is referred to as [60]fullerene.

Pyrolysis of Fullerene:

The term "pyrolysis of a fullerene" means that the spherical closed-shell structure of the fullerene is destroyed by heating and the fullerene thus comes into the state of having no structure characteristic of a fullerene. The term "pyrolysis temperature of a fullerene" means the temperature at which the spherical closed-shell structure of the fullerene is thermally destroyed and the fullerene thus comes into the state of having no structure characteristic of a fullerene.

In an oxygen atmosphere, the pyrolysis of a fullerene proceeds as the destruction of the spherical closed-shell structure of the fullerene due to oxidation/combustion. Pyrolysis temperature indicates the temperature at which the oxidation/combustion occurs. The pyrolysis temperatures of fullerenes in an oxygen atmosphere are generally 500° C. or higher.

In an inert atmosphere, the pyrolysis of a fullerene proceeds as the disappearance of the spherical closed-shell structure of the fullerene due to sublimation. Pyrolysis temperature indicates the temperature at which the sublimation occurs. The pyrolysis temperature of fullerenes in an inert atmosphere are generally 700° C. or higher.

Pyrolysis of Fullerene Derivative:

The term "pyrolysis of a fullerene derivative" means any reaction in which the one or more, organic or inorganic groups of atoms bonded to the fullerene framework, preferably the one or more substituents bonded to the fullerene surface, are eliminated or decomposed by a heat treatment to yield a fullerene film and a fullerene polymer.

The atmosphere in which the fullerene derivative is pyrolyzed is not particularly limited. The atmosphere may be an oxygen-containing atmosphere such as the air or may be an atmosphere containing no oxygen, such as a nitrogen atmosphere, reduced-pressure atmosphere, or vacuum. However, an oxygen-free atmosphere in which oxidation/combustion can be clearly distinguished from pyrolysis and oxidation/combustion is less apt to occur is preferred. More specifically, any of a nitrogen atmosphere, inert gas atmosphere (or an atmosphere of a mixture of these), reduced-pressure atmosphere, and vacuum is preferred.

In particular, fullerene derivatives having partial structures represented by formulae (1) and (2) given above and ones having a partial structure represented by formula (5) which will be given later have a pyrolysis temperature lower than the pyrolysis temperature of the fullerene and, hence, are rapidly pyrolyzed. In this pyrolysis, the atmosphere is not particularly limited with respect to whether oxygen is present or absent, etc. Preferred is an atmosphere containing no oxygen. More specifically, any of a nitrogen atmosphere, inert gas atmosphere (or an atmosphere of a mixture of these), reduced-pressure atmosphere, and vacuum is preferred. Especially preferred from the standpoint of cost is a nitrogen atmosphere or an inert gas atmosphere. This atmosphere is suitable because oxidation/combustion is prevented and the fullerene film (or fullerene polymer) obtained can be prevented from further undergoing oxidation/combustion.

The term "pyrolysis temperature of a fullerene derivative" means the temperature at which the one or more, organic or inorganic groups of atoms bonded to the fullerene framework, preferably the one or more substituents bonded to the fullerene surface, begin to be eliminated or decomposed by a heat treatment. The temperature at which a weight loss begins to occur in thermal analysis by TG-DTA can be used as the pyrolysis temperature.

The pyrolysis temperature of a fullerene derivative is a temperature which is lower than the pyrolysis temperature of the fullerene and which desirably is 100° C. or higher, preferably 120° C. or higher, more preferably 150° C. or higher, even more preferably 200° C. or higher, and is 500° C. or lower, preferably 450° C. or lower, more preferably 400° C. or lower, even more preferably 350° C. or lower. In case where the fullerene derivative has too low a pyrolysis temperature, there is a possibility that this derivative might have low stability, resulting in poor operation efficiency. In case where the fullerene derivative has too high a pyrolysis temperature, there is a possibility that the fullerene framework might suffer combustion, making it impossible to stably form a film.

The fullerene derivative to be pyrolyzed may contain an acid or an acid generator which generates an acid upon exposure to light or heating. The acid and the acid generator may be used in combination.

A fullerene derivative generally undergoes a weight decrease through pyrolysis. The weight decrease can be observed in thermal analysis by TG-DTA. It is preferred that the weight loss through pyrolysis should be generally 5% by weight or more, preferably 10% by weight or more, more preferably 20% by weight or more, based on the weight before the pyrolysis. The weight loss thereof is generally 80% by weight or less, preferably 75% by weight or less, more preferably 50% by weight or less.

In case where the weight loss is too small, there is a possibility that film formation might be insufficient. In case where the weight loss is too large, there is a possibility that the volumetric shrinkage occurring upon heating might result in impaired film quality.

Once a fullerene derivative yields a fullerene film or fullerene polymer through pyrolysis, this product generally is a stable and irreversible fullerene film or fullerene polymer.

Fullerene Polymer:

The term "fullerene polymer" means a product of polymerization in which fullerene molecules polymerize while retaining the spherical closed-shell structure of the fullerene. More specifically, that term means an arrangement of molecules having a closed-shell fullerene structure, the arrangement having an absorption spectrum characteristic of fullerenes in XRD analysis, giving an endothermic peak attributable to the closed-shell fullerene structure in thermal analysis, and being insoluble in solvents in which the fullerene or the fullerene derivative was soluble before the heat treatment.

Examples of the fullerene polymer may include structures formed by bonding between carbon atoms constituting closed-shell fullerene structures, such as dimers and higher-order polymers of a fullerene or analogue thereof or arrangements of molecules of a fullerene or analogue thereof. So long as the closed-shell structures are maintained, the structure of the fullerene polymer may contain atoms other than carbon, such as, e.g., the nitrogen, oxygen, or sulfur atoms derived from the substituents possessed by the fullerene derivative before the heat treatment.

The term "fullerene polymer film" means a filmy substance made of the fullerene polymer. The term "structure of a fullerene polymer" means a conception which includes not only the atoms constituting the closed-shell fullerene structures but also substituents added to atoms on the fullerene framework, atoms or molecules included in the fullerene framework, and atoms or molecules coordinated to the outside of the fullerene framework.

Fullerene Film:

The term "fullerene film" means a filmy substance having spherical closed-shell structures of a fullerene. Specifically, that term means a filmy substance formed while maintaining the closed-shell structures of fullerene molecules, and means a conception including a film of the fullerene polymer.

The term "fullerene film" herein means a filmy substance formed by the reaction, polymerization, etc. of a fullerene itself, unlike a filmy substance physically formed, for example, from a composition of a fullerene and a thermosetting resin.

Specifically, that term means a filmy substance which has a diffraction pattern characteristic of fullerenes in XRD analysis, shows a peak attributable to the closed-shell fullerene structure in thermal analysis, and is insoluble in solvents in which fullerenes are soluble. So long as the closed-shell structures of the fullerene molecules are maintained, the structure of the polymer may contain atoms other than carbon, such as, e.g., the nitrogen, oxygen, or sulfur atoms derived from the substituents possessed by the fullerene derivative before pyrolysis. The structure preferably contains atoms of at least one of nitrogen, oxygen, and sulfur, more preferably contains atoms of at least one of nitrogen and oxygen, and even more preferably contains atoms of nitrogen and oxygen. It is thought that when part of the carbon atoms in a carbon material are replaced by atoms of, e.g., nitrogen, this carbon material changes not only in chemical properties including oxidation resistance but in electrical, magnetic, and mechanical properties and comes to have a wider material diversity. The content of at least either of oxygen atoms and nitrogen atoms in the fullerene polymer is preferably 0.1% by weight or higher, more preferably 0.5% by weight or higher, even more preferably 1% by weight or higher. The content of at least either of oxygen atoms and nitrogen atoms in the fullerene polymer is generally 30% by weight or lower, preferably 20% by weight or lower, more preferably 15% by weight or lower, even more preferably 10% by weight or lower. It is thought that the presence of those atoms contained in a given amount renders the fullerene film rich in processability and stable. Too low contents thereof result in a possibility that a sufficient property change cannot be obtained. In case where the content thereof is too high, there is a possibility that this film might not have the properties required of fullerene films.

The term "fullerene film including a fullerene polymer" means a film which may include not only a fullerene polymer but also other ingredients such as, e.g., a fullerene remaining unpolymerized, a fullerene derivative remaining unpyrolyzed, or carbon atoms, molecules, etc. resulting from the destruction of closed-shell fullerene structures.

(2) Synthesis of Fullerene Derivative:

For synthesizing a fullerene derivative, an available fullerene having any desired number of carbon atoms can be used as a raw material. However, [60]fullerene, [70]fullerene, and [84]fullerene are preferred from the standpoint of easy availability. From the standpoint of easy procurement in an industrially necessary quantity, [60]fullerene and [70]

fullerene are more preferred. In particular, [60]fullerene is most preferred because it is characterized by having a symmetrical structure.

As the raw-material fullerene, an isolated fullerene may be used alone. However, a mixture of two or more fullerenes may be used. The fullerene mixture may be an unpurified one separated from by-products in a fullerene production step, or may be one obtained by mixing two or more fullerenes in any desired proportions.

For producing a fullerene film, use can be made of any desired fullerene derivative in which the one or more functional groups bonded to the fullerene surface are eliminated or decomposed by a heat treatment conducted at a temperature lower than the pyrolysis temperature of the fullerene to thereby yield the unsubstituted fullerene.

Examples of the fullerene derivative usable for producing a fullerene film are shown by the following formulae (3) and (4). Although derivatives of [60]fullerene are shown by the following formulae, derivatives of other fullerenes (including fullerene mixtures) are possible.

[Ka-7]

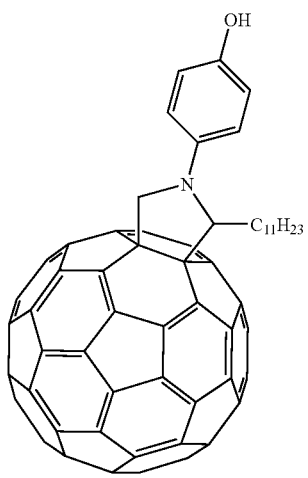

(3)

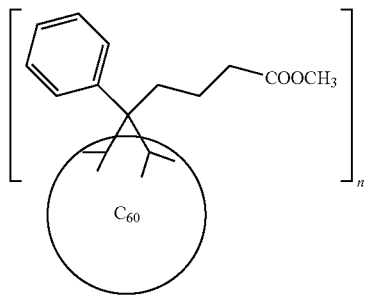

(4)

The fullerene derivative represented by formula (3) can be synthesized by a Prato reaction in which [60]fullerene, N-hydroxyphenylglycine, and 1-dodecanal are used as starting materials. The fullerene derivatives represented by formula (4) can be synthesized by the reaction of [60]fullerene with methyl 4-benzoylbutyrate p-tosylhydrazone.

A preferred group of fullerene derivatives includes products of addition reactions with a fullerene, such as, e.g., aminated fullerenes. Examples of preferred fullerene derivatives include aminated fullerene derivatives obtained by reacting a fullerene with a secondary amine $NHR^1R^2$ ($R^1$ and $R^2$ each independently are a hydrocarbon group which may have any desired substituent(s), provided that $R^1$ and $R^2$, in cooperation with any of a carbon atom, nitrogen atom, and oxygen atom bonded to both of $R^1$ and $R^2$, may have formed a nitrogen-containing ring having any desired substituent(s)) in the presence of oxygen and having on the fullerene framework a partial structure represented by general formula (1) or (2) given above or by the following general formula (5).

[Ka-8]

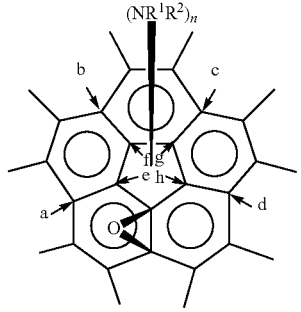

(5)

In general formula (5), $R^1$ and $R^2$ each independently are a hydrocarbon group which may have any desired substituent (s), provided that $R^1$ and $R^2$, in cooperation with any of a carbon atom, nitrogen atom, oxygen atom, and sulfur atom bonded to both of $R^1$ and $R^2$, may have formed a nitrogen-containing ring having any desired substituent(s); and n represents an integer of 1 to 3.

In general formula (5), the amino group $NR^1R^2$ has been bonded to one, two, or three carbon atoms selected from the four carbon atoms indicated by a, b, c, and d. In this case, a hydrogen atom may have been bonded to one or more of the carbon atoms e to h so that all the carbon atoms constituting the fullerene framework satisfy the valence.

Preferred aminated fullerene derivatives are tetra-aminated fullerenes having a partial structure represented by general formula (1) (tetraaminofullerene epoxides) from the standpoints of solubility and ease of film formation. Penta-aminated fullerenes having a partial structure represented by general formula (2) also are preferred for the same reasons. Furthermore, mixtures of these two kinds of fullerene derivatives are also preferred.

Specific examples of the substituents $R^1$ and $R^2$ are as follows. In the case where $R^1$ and $R^2$ are not bonded to each other, $R^1$ and $R^2$ generally are substituted or unsubstituted hydrocarbon groups. Examples of the hydrocarbon groups include linear or branched alkyl groups or alkenyl groups.

Examples of the alkyl groups include alkyl groups having 1-18 carbon atoms, preferably 1-6 carbon atoms. Specific examples thereof include methyl, ethyl, n-propyl, isopropyl, n-butyl, isobutyl, t-butyl, pentyl, hexyl, cyclopropyl, cyclopentyl, cyclohexyl, benzyl, phenethyl, and these hydrocarbon groups having one or more substituents.

Examples of the alkenyl groups include alkenyl groups having 2-18 carbon atoms, preferably 2-6 carbon atoms. Specific examples thereof include vinyl, propenyl, isopropenyl, allyl, butenyl, isobutenyl, pentenyl, and hexenyl.

The substituents which may be possessed by the hydrocarbon groups of $R^1$ and $R^2$ and by the nitrogen-containing ring are not particularly limited, and may be any desired substituents. Examples thereof include alkoxy groups such as methoxy and phenoxy; siloxy groups such as trimethylsiloxy; alkoxycarbonyl groups such as methoxycarbonyl, t-butoxycarbonyl, and benzyloxycarbonyl; ketal groups such as alkylamino groups, alkanoyl groups, and ethylenedioxy; and acetal groups such as tetrahydropyranyloxy. Furthermore, alkyl, aryl, alaryl, and other groups having any of those substituents, such as, e.g., (t-butyldimethyolsilyloxy)methyl, can also be substituents of $R^1$ and $R^2$.

In the case where $R^1$ and $R^2$, in cooperation with an atom X bonded to both of $R^1$ and $R^2$ (X is any of a carbon atom, nitrogen atom, oxygen atom, and sulfur atom), forms a cyclic substituent containing one or more nitrogen atoms (nitrogenous cyclic group), $R^1$—X—$R^2$ generally is a divalent organic group having 3-6 carbon atoms. The $R^1$—X—$R^2$ chain may contain one or more heteroatoms, e.g., oxygen, nitrogen, or sulfur. Preferred of such nitrogen-containing rings is a 4- to 7-membered ring containing at least one secondary nitrogen atom.

Specific examples of the nitrogen-containing ring include: (a) 3- to 7-membered saturated nitrogenous heterocyclic groups containing one to four nitrogen atoms, such as azetidine, pyrrolidine, imidazolidine, piperidine, piperazine, and homopiperazine; (b) 3- to 7-membered unsaturated nitrogenous heterocyclic groups containing one to four nitrogen atoms, such as pyrrole, pyrroline, imidazoline, imidazole, pyrazole, triazole, and tetrazole; and (c) 3- to 7-membered saturated nitrogenous heterocyclic groups containing one to three atoms of one to three kinds selected from nitrogen, oxygen, and sulfur atoms, such as morpholine and thiomorpholine.

In this case also, such nitrogen-containing rings may have, bonded thereto, any of the substituents shown above.

The substituent $R^1$ or $R^2$ preferably is one having the cyclic substituent described above containing the nitrogen atom to which $R^1$ and $R^2$ are bonded (nitrogenous cyclic group) which may have one or more substituents. More preferred is the nitrogenous cyclic group described above containing the nitrogen atom to which $R^1$ and $R^2$ are bonded and having one or more substituents. Most preferred is the cyclic substituent described above containing the nitrogen atom to which $R^1$ and $R^2$ are bonded (nitrogenous cyclic group) which has one or more alkoxycarbonyl groups as substituent(s).

A most preferred aminated fullerene derivative is a compound constituted of the [60]fullerene represented by the following formula (6-1) which has 3- to 7-membered saturated nitrogenous heterocyclic groups $A^1$ each represented by formula (7), which each have N-alkoxycarbonyl group (in this case, the alkoxy group preferably is a branched alkoxy group having 3-10 carbon atoms) and have two to four nitrogen atoms.

[Ka-9]

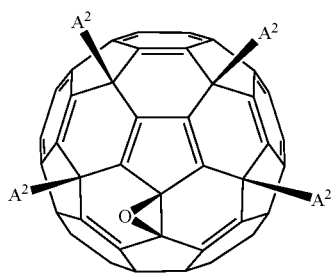

(6-1)

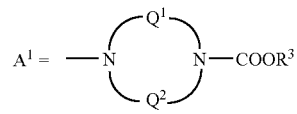

(7)

In the formula, $Q^1$ and $Q^2$ represent any desired nonmetal atom combinations or bonds which, in cooperation with the nitrogen atoms bonded thereto, form a 3- to 7-membered saturated nitrogenous heterocyclic group having two to four nitrogen atoms. $R^3$ represents a branched alkyl group having 3-10 carbon atoms.

Another most preferred aminated fullerene derivative is a compound constituted of the [60]fullerene represented by the following formula (6-2) and cyclic amino groups each substituted with an ester group and bonded to the fullerene through the nitrogen atom in the cyclic amino group. The cyclic amino groups each are a 3- to 7-membered saturated nitrogenous heterocyclic group $A^2$ represented by the following formula (8).

[Ka-10]

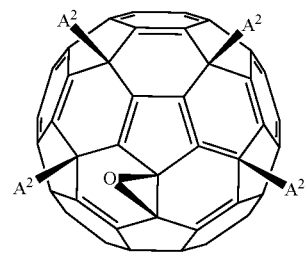

(6-2)

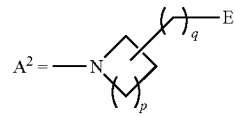

(8)

The cyclic amino groups substituted with an ester group E each represent a cyclic secondary amino group formed by bonding one or more ester groups E to any of the carbon atoms constituting the ring of a cyclic amino group of $A^2$ represented by formula (8) either directly or through a carbon chain having 1-2 carbon atoms. Symbol p represents an integer of 1-4.

The ester group E has any of the following structures.

—OC(=O) $R^4$              (1)

—OC(=O) O$R^4$            (2)

—C(=O)O$R^4$              (3)

In the formulae, $R^4$ is a bulky organic group having 4-10 carbon atoms and is a group having one or more quaternary carbon atoms. $R^4$ may have one or more substituents.

Examples of $R^4$ include t-butyl, neopentyl, 2-(t-butyl)ethyl, 3-(t-butyl)propyl, 4,4-dimethylcyclohexyl, 1-methyl-1-cyclohexyl, and 2,2,3-(trimethyl)-1-n-propyl. Preferred of these are chain groups. Specifically, t-butyl, neopentyl, 2-(t-butyl)ethyl, 3-(t-butyl)propyl, and 2,2,3-(trimethyl)-1-n-propyl are preferred. More preferred are the ester groups having 4-6 carbon atoms, which have higher polarity, i.e., t-butyl, neopentyl, and 2-(t-butyl)ethyl. Most preferred are t-butyl and neopentyl.

The bonding between the ester group and each cyclic secondary amino group may be direct bonding. Namely, in formula (8) in this case, q=0. Alternatively, the ester group may be bonded through a carbon chain. In the case of bonding through a carbon chain, the number of carbon atoms q in the carbon chain is generally 1-3, preferably 1-2. Specifically, the carbon chain may be methylene or ethylene.

That position in each cyclic amine in which the ester group is bonded is not particularly limited so long as the position is on a carbon atom. However, the bonding of the ester group to a carbon atom bonded to the nitrogen atom is undesirable because this position reduces reactivity with the fullerene.

The aminated fullerene derivative constituted of the [60]fullerene represented by formula (6-2) and substituents represented by the cyclic amino group of formula (8) substituted with an ester group is preferred because the decomposition of the ester group bonded to each $A^2$ directly or through a carbon chain having 1-2 carbon atoms and the resultant formation of a fullerene film or fullerene polymer do not generate a secondary amine unlike the aminated fullerene derivative which is a product of reaction of the [60]fullerene of formula (6) with 3- to 7-membered saturated nitrogenous heterocyclic groups A having an N-alkoxycarbonyl group and represented by formula (7). Namely, the former derivative is preferred because it is usable also in environments or applications where resistance to amines or basic properties is low.

In addition, the former aminated fullerene has a lower nitrogen atom content than other most preferred aminated fullerenes. Because of this, when used in forming a fullerene film or fullerene polymer film by the process of the invention, the former aminated fullerene is suitable for forming a fullerene film or fullerene polymer film having a low nitrogen content.

Still another most preferred aminated fullerene derivative is a compound constituted of the [60]fullerene represented by the following formula (6-3) and 3- to 7-membered saturated nitrogenous heterocyclic groups $A^3$ each substituted with an ester group and represented by the following formula (9), each group $A^3$ being bonded to the fullerene at a nitrogen atom in the $A^3$.

[Ka-11]

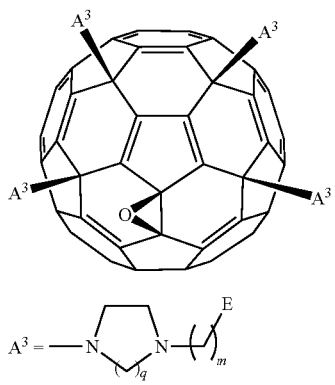

(6-3)

(9)

$A^3$ represented by formula (9) is a cyclic amine having two nitrogen atoms on the ring. This cyclic amine has an ester group E bonded to one of the nitrogen atoms through an alkylene chain having m carbon atoms and is bonded to the fullerene framework at the other nitrogen atom. Incidentally, the two nitrogen atoms are bonded to each other through an ethylene chain and an alkylene chain represented by $(CH_2)_r$.

Symbol r indicates the number of methylene groups in the alkylene chain, and is generally an integer of 1-4, preferably an integer of 1-3, more preferably an integer of 1-2, especially preferably 2.

Examples of the cyclic amine framework in each cyclic secondary amino group in the invention include N-imidazolidino group, N-piperazino group, and N-homopiperazino group. From the standpoint of the availability of the corresponding cyclic secondary amines, N-piperazino group and N-homopiperazino group are preferred. Most preferred is N-piperazino group.

E represents an ester group, which is a structure selected from any one of —OC(=O)$R^5$, —OC(=O)O$R^5$, —C(=O)O$R^5$, and —OC(=O)$R^5$. In these formulae, $R^5$ is a bulky organic group having 4-10 carbon atoms. Specifically, $R^5$ is an organic group having one or more branches. In particular, it is preferred that the organic group should have a branch including a quaternary carbon atom. The organic group may further have one or more substituents. Of those groups, an ester group represented by —OC(=O)$R^5$ is preferred.

Examples of $R^5$ include t-butyl, neopentyl, 2-(t-butyl)ethyl, 3-(t-butyl)propyl, 4,4-dimethylcyclohexyl, 1-methyl-1-cyclohexyl, and 2,2,3-(trimethyl)-1-n-propyl. Most preferred of these is t-butyl.

Symbol m indicates the number of carbon atoms of the alkylene chain which bonds the ester group E to the cyclic secondary amino group, and is generally 1-3, preferably 1-2, more preferably 1. When m is 1, the alkylene chain represents methylene. Most preferred is methylene.

The aminated fullerene having amino groups represented by formula (9), when used in forming a fullerene film or fullerene polymer film by the process of the invention, can form a film which is reduced in weight loss in a high-temperature region of 700° C. and higher in an inert atmosphere. Consequently, this aminated fullerene is suitable for use in forming a film stable even in a high-temperature region. The reason why this aminated fullerene can form a film reduced in weight loss in a high-temperature region of 700° C. and higher is not clear. However, it is thought that that tertiary amino group on each cyclic amine which is not bonded to the fullerene functions to accelerate crosslinking between fullerene frameworks during pyrolysis and thereby form the film.

Furthermore, the aminated fullerene having amino groups represented by formula (9) shows high solubility in alcohols including methanol. Because of this, from the standpoint of a wide choice of solvents usable in coating fluid application, this aminated fullerene is advantageous over other preferred aminated fullerenes.

An aminated fullerene derivative may be synthesized by reacting a fullerene with a secondary amine in air at room temperature using a visible-light source such as, e.g., an incandescent lamp (*Org. Lett.*, 2000, 2, p. 3663) or in the presence of an oxidizing agent such as cumene hydroperoxide (JP-A-2006-199674 (patent document 1)). In the case where [60]fullerene is used as a starting material to conduct this synthesis reaction in the presence of an oxidizing agent, the main reaction scheme is as shown below. In the following scheme, (1a), (2a), and (5a) represent [60]fullerene derivatives respectively having partial structures represented by partial structural formulae (1), (2), and (5).

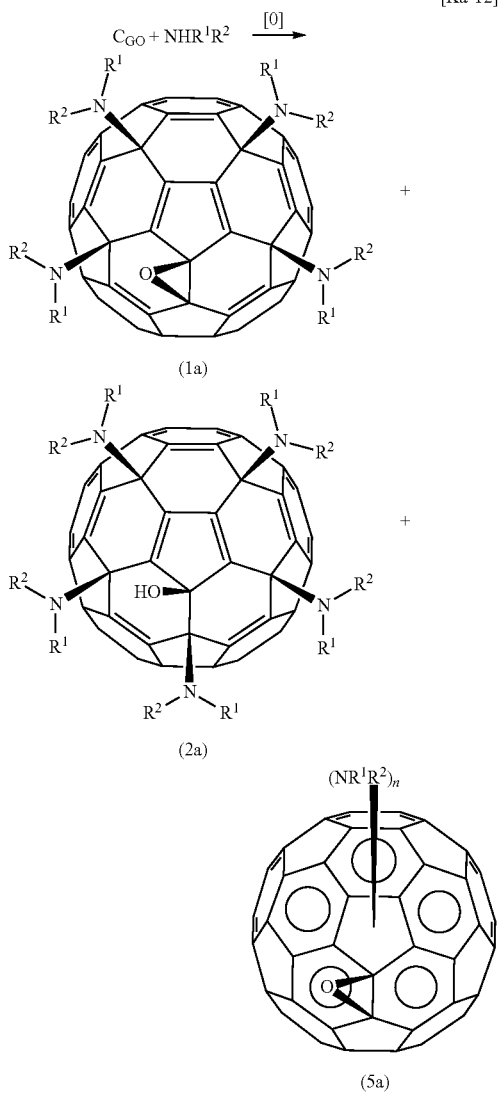

[Ka-12]

(1a)

(2a)

(5a)

Reaction solvents suitable for use in the synthesis of aminated fullerene derivatives are ones in which fullerenes and the secondary amine and hydroperoxide to be used in the reaction dissolve. The solvents are not particularly limited in kind unless they inhibit the reaction. Examples thereof include solvents in which fullerenes are highly soluble, such as aromatic hydrocarbons, halogenated aromatic hydrocarbons, solvents of the heterocyclic molecule type, solvents of the alkane molecule type, solvents of the haloalkane molecule type, and polar solvents.

Especially preferred examples thereof, from the standpoints of attaining high solubility and enabling a fullerene solution to be stored in a small volume, include toluene (2.9 mg/mL), xylene (5.2 mg/mL), o-xylene (8.7 mg/mL), m-xylene (1.4 mg/mL), p-xylene (5.9 mg/mL), ethylbenzene (2.6 mg/mL), 1,2,3-trimethylbenzene (4.7 mg/mL), 1,3,5-trimethylbenzene (1.5 mg/mL), 1,2,4-trimethylbenzene (17.9 mg/mL), 1-methylnaphthalene (33.2 mg/mL), and 1-phenylnaphthalene (50 mg/mL). The numeral in the parenthesis following each solvent name indicates the solubility of [60] fullerene in the solvent (the same applies hereinafter).

Specific examples of the halogenated aromatic hydrocarbons include chlorobenzene (5.7 mg/mL), o-dichlorobenzene (24.6 mg/mL), m-dichlorobenzene (2.4 mg/mL), bromobenzene (2.8 mg/mL), and 1,2,4-trichlorobenzene (10.4 mg/mL).

Examples of the solvents of the heterocyclic molecule type include tetrahydrofuran, tetrahydrothiophene, 2-methylthiophene, pyridine, quinoline, and thiophene. Industrially preferred of these solvents of the heterocyclic molecule type are tetrahydrofuran (0.037 mg/mL) and quinoline (7.2 mg/mL).

Examples of the solvents of the alkane molecule type include n-hexane, cyclohexane, n-octane, 2,2,4-trimethylpentane, n-decane, n-dodecane, n-tetradecane, decalin, cis-decalin, and trans-decalin. Industrially preferred of these solvents of the alkane molecule type are n-hexane (0.04 mg/mL), cyclohexane (0.05 mg/mL), n-decane (0.07 mg/mL), n-dodecane (0.09 mg/mL), n-tetradecane (0.126 mg/mL), and decalin (4.6 mg/mL).

Examples of the solvents of the haloalkane molecule type include dichloromethane, chloroform, carbon tetrachloride, 1,2-dibromoethane, trichloroethylene, tetrachloroethylene, dichlorodifluoroethane, 1,1,2-trichloro-1,2,2-trifluoroethane, and 1,1,2,2-tetrachloroethane. Industrially preferred of these solvents of the haloalkane molecule type are dichloromethane (0.25 mg/mL) and chloroform (0.5 mg/mL).

Examples of the polar solvents include N-methyl-2-pyrrolidone (0.89 mg/mL), dimethyl sulfoxide, N,N-dimethylformamide, and carbon disulfide.

Industrially preferred of those solvents are aromatic hydrocarbons and halogenated aromatic hydrocarbons. More preferred are benzene, toluene, xylene, 1,2,4-trimethylbenzene, chlorobenzene, and o-dichlorobenzene. These solvents may be used alone as a reaction solvent, or two or more solvents may be used in combination as a reaction solvent.

Furthermore, a polar solvent such as carbon disulfide, dimethyl sulfoxide, or N,N-dimethylformamide or a mixed solvent composed of such polar solvents may be used as those solvents.

It is more preferred that any of those aromatic hydrocarbons and halogenated aromatic hydrocarbons should be used as a mixture thereof with a polar solvent because use of this mixed solvent is expected to bring about a great improvement in reaction rate. When a precursor for a hydroperoxide is used, use of a polar solvent enables the reaction to proceed without necessitating light irradiation. Although the mechanism of this function of a polar solvent is unclear, the solvent is presumed to influence the activation of the hydroperoxide precursor.

A polar solvent is a solvent having one or more polar functional groups. Specifically, a polar solvent is a compound whose dielectric constant $\epsilon_r$, which is an index to the polarity of solvent, is generally 25 or larger, preferably 30 or larger, and is generally 200 or smaller, preferably 100 or smaller, more preferably 50 or smaller. Dielectric constant $\epsilon_r$ (described in, for example, *Solvents and Solvent Effects in Organic Chemistry,* 2nd Ed. , 1990, VCH, p. 59) is a value inherent in each compound. Dielectric constant is a ratio between dielectric flux density D and resultant electric field E (D/E), and is a factor which indicates the relationship in a substance between charge and resultant force. The dielectric constants $\epsilon_r$ of several polar solvents are shown below.

N-methylformamide: 182.4
N,N-dimethylformamide: 36.71
N,N-dimethylacetamide: 37.78
N-methylpyrrolidone: 32.2
Dimethyl sulfoxide: 46.45
Sulfolane: 43.3
N,N'-dimethylpropyleneurea: 36.12
Hexamethylphosphoric triamide: 29.6

Preferred polar solvents are ones which are evenly miscible with the aromatic solvent to be used, in a proportion not lower than a given value. In particular, polar solvents evenly miscible with the aromatic solvent in such a proportion that the aromatic solvent/polar solvent ratio is 100:(1 or larger), especially 10:(1 or larger), are preferred. Examples thereof include sulfoxides such as dimethyl sulfoxide and diphenyl sulfoxide; sulfones such as dimethyl sulfone and sulfolane; amides such as N,N-dimethylformamide, N,N-dimethylacetamide, N-methylformamide, formamide, and N-methylpyrrolidone; urea compounds such as N,N'-dimethylpropyleneurea; phosphoric acid amides such as hexamethylphosphoramide; and phosphorous acid amides such as hexamethylphosphorictriamide. Of these, sulfoxides and amides are more preferred because of their high effect. From the standpoint of industrial easy availability, dimethyl sulfoxide (DMSO) and N,N-dimethylformamide (DMF) are especially preferred. In the case of using a polar solvent, the amount of this solvent to be used may be in the range of preferably 1-99%, more preferably 5-50%, in terms of volume proportion to the aromatic solvent, although the amount thereof depends on the kind thereof. The reasons for this are as follows. In case where the proportion of the polar solvent is too small, the effect of the polar solvent is not sufficiently produced. Too large proportions of the polar solvent result in relatively reduced proportions of the aromatic solvent and, hence, the fullerene and an intermediate product show reduced solubility in the solvent.

In this operation, an aminated fullerene derivative in which five molecules of the secondary amine have been added is obtained as a by-product. However, the two aminated fullerene derivatives, without being separated from each other, can be used in the mixture state as a raw material for a highly carbon-containing thin film. Incidentally, the two derivatives can be separated by column chromatography.

(3) Process for Producing Fullerene Film:

A fullerene film may be produced by a process including: a first step in which a solution of the fullerene derivative obtained in the manner described above is prepared and applied to a substrate; and a second step in which the coating film obtained in the first step is heated at a temperature which is higher than the pyrolysis temperature of the fullerene derivative and lower than the pyrolysis temperature of the fullerene to pyrolyze at least part of the fullerene derivative and thereby obtain a fullerene film.

After a solution of the fullerene derivative is prepared and applied to a substrate, the solvent is removed, whereby a coating film of the fullerene derivative is obtained.

As the solvent for preparing the fullerene derivative solution, use can be made of any desired solvent in which the fullerene derivative has sufficient solubility and which can be volatilized at ordinary or a reduced pressure either at room temperature or with heating. However, a solvent can be suitably selected while taking account of availability, cost, toxicity, safety, etc.

Examples of the solvent include monohydric or polyhydric alcohols, ketones, ethers, esters, aromatic hydrocarbons, halogenated aromatic hydrocarbons, solvents of the heterocyclic molecule type, solvents of the alkane molecule type, solvents of the haloalkane molecule type, acetonitrile, dimethyl sulfoxide (DMSO), N,N-dimethylformamide (DMF), nitromethane, nitroethane, N-methyl-2-pyrrolidone, and water.

Examples of the monohydric or polyhydric alcohols include methanol, ethanol, 1-propanol, 2-propanol, butanol, ethylene glycol, propylene glycol, diethylene glycol, glycerol, and dipropylene glycol.

Examples of the ketones include acetone, MEK (methyl ethyl ketone), 2-heptanone, methyl isopropyl ketone, MIBK (methyl isobutyl ketone), and cyclohexanone.

Examples of the ethers include dimethyl ether, diethyl ether, dibutyl ether, and tetrahydrofuran (THF).

Examples of the esters include ethyl acetate, butyl acetate, propyl acetate, ethyl lactate, GBL (γ-butyrolactone), PGMEA (propylene glycol monomethyl ether acetate), and PGME (propylene glycol monomethyl ether).

Examples of the aromatic hydrocarbons include benzene, toluene, xylene, o-xylene, m-xylene, p-xylene, ethylbenzene, 1,2,3-trimethylbenzene, 1,3,5-trimethylbenzene, 1,2,4-trimethylbenzene, 1-methylnaphthalene, and 1-phenylnaphthalene.

Examples of the halogenated aromatic hydrocarbons include chlorobenzene, o-dichlorobenzene, m-dichlorobenzene, bromobenzene, and 1,2,4-trichlorobenzene.

Examples of the solvents of the heterocyclic molecule type include tetrahydrofuran, tetrahydrothiophene, 2-methylthiophene, pyridine, quinoline, and thiophene.

Examples of the solvents of the alkane molecule type include n-hexane, cyclohexane, n-octane, 2,2,4-trimethylpentane, n-decane, n-dodecane, n-tetradecane, decalin, cis-decalin, and trans-decalin.

Examples of the solvents of the haloalkane molecule type include dichloromethane, chloroform, carbon tetrachloride, 1,2-dibromoethane, trichloroethylene, tetrachloroethylene, dichlorodifluoroethane, 1,1,2-trichloro-1,2,2-trifluoroethane, and 1,1,2,2-tetrachloroethane.

More preferred examples of solvents among those solvents include PGMEA, PGME, ethyl lactate, 2-heptanone, cyclohexanone, MEK, GBL, and NMP (N-methyl-2-pyrrolidone).

It is difficult to unconditionally fix the concentration of the fullerene derivative solution because the concentration thereof varies depending on the solubility of the fullerene derivative in the solvent, thickness of the fullerene film, etc. However, the concentration thereof is preferably 1-30% by mass, more preferably 10-25% by mass, even more preferably 20-25% by mass. In case where the concentration of the fullerene derivative solution is lower than 1% by mass, it is necessary to use the solvent in a large amount and this is uneconomical. In addition, such too low concentrations result in the necessity of repeatedly conducting a coating operation in order to obtain a fullerene film having a large thickness. On the other hand, in case where the concentration of the fullerene derivative solution exceeds 30% by mass, this solution is high in viscosity, etc. and is hence difficult to handle, making it difficult to obtain a fullerene film having an even thickness.

The application of the fullerene derivative solution to a substrate can be conducted by any desired known technique such as, e.g., dip coating, spin coating, or spray coating.

Examples of the shape of the substrate include platy, filmy, spherical, bulky, and fibrous shapes. With respect to the material of the substrate, use can be made of a substrate made of any desired material which suffers neither pyrolysis nor deformation during the heat treatment in the second step. Usable materials include inorganic materials such as glasses, semiconductors, metals, and concrete. Besides these, organic materials having heat resistance, such as, e.g., polyimide resins, may be used when the fullerene derivative has a decomposition temperature of, e.g., 200° C. or lower.

For removing the solvent, any desired technique can be used according to the boiling point, volatility, etc. of the solvent used. Examples of techniques usable for removing the solvent include air drying at room temperature and atmospheric pressure, vacuum drying at room temperature and reduced pressure, and heating at atmospheric or reduced pressure. A combination of two or more of these techniques may be used. In the case of solvent removal by heating, it is preferred to remove the solvent at a temperature lower than 500° C., preferably a temperature of 300° C. or lower, at which the solvent removal is not accompanied by destruction of the closed-shell structure of the fullerene. It is more preferred to remove the solvent at 100° C. or lower in order to prevent the coating film from bumping, etc. Even more preferred is to remove the solvent in an inert atmosphere. Solvent removal may be conducted simultaneously with a fullerene polymerization reaction under temperature conditions which do not result in the destruction of the closed-shell structure of the fullerene.

The coating film of a fullerene derivative thus obtained is heat-treated, upon which the fullerene derivative is pyrolyzed and the functional groups are hence eliminated. As a result, a fullerene film including a fullerene polymer is obtained.

It is preferred that the heat treatment should be conducted in an inert atmosphere, e.g., nitrogen, in order to inhibit the destruction of the closed-shell structure of the fullerene, etc. However, in the case of a fullerene derivative having a partial structure represented by formula (1) or formula (2) on the fullerene framework, a fullerene film can be obtained even through a heat treatment in air because the pyrolysis temperature of this fullerene derivative is about 200° C.

Thus, a fullerene polymer can be easily produced by heat-treating and pyrolyzing either of those fullerene derivatives respectively having partial structures represented by formulae (1) and (2) or a mixture of these. Furthermore, by utilizing the process, a fullerene film can be easily produced from either of those fullerene derivatives respectively having partial structures represented by formulae (1) and (2) or a mixture of these.

The thickness of the fullerene film can be suitably regulated in the range of from several nanometers to tens of micrometers according to uses, etc. by regulating the concentration or amount of the fullerene derivative solution to be applied to a substrate. The lower limit of the thickness thereof is preferably 10 nm, more preferably 50 nm. There is no theoretical upper limit on the thickness of the film so long as the solution is repeatedly applied. However, the upper limit of the thickness thereof is preferably 1 mm, more preferably 100 µm. This film thickness can be determined by known film thickness determination techniques.

In case where the thickness of the film is smaller than 10 nm, there is a possibility that the film formed might not be even. In case where the thickness of the film is larger than 1 mm, there is a possibility that this film might have cracks or the like due to thermal shrinkage during the heating, etc.

Process for Producing Fullerene Polymer or Polymer Film:

A fullerene polymer is obtained by pyrolyzing a fullerene derivative in the manner described above. A fullerene derivative is formed into a film and pyrolyzed, whereby a fullerene film including a fullerene polymer can be obtained. Namely, a fullerene polymer film is obtained. A fullerene polymer, irrespective of the shape thereof, is obtained by the pyrolysis of a fullerene derivative. A fullerene polymer is obtained preferably by the pyrolysis of a fullerene derivative having a partial structure represented by any of partial structural formulae (1), (2), and (5), more preferably by the pyrolysis of a fullerene derivative including [60]fullerene having a partial structure represented by any of partial structural formulae (1), (2), and (5), even more preferably by the pyrolysis of a fullerene derivative including a [60]fullerene derivative having a partial structure represented by either of partial structural formulae (1) and (2). The fullerene polymer obtained preferably contains atoms of at least either of oxygen and nitrogen, and the content of the at least either of oxygen atoms and nitrogen atoms therein is preferably 0.1% by weight or higher, more preferably 0.5% by weight or higher, even more preferably 1% by weight or higher. The content of the at least either of oxygen atoms and nitrogen atoms therein is generally 30% by weight or lower, preferably 20% by weight or lower, more preferably 15% by weight or lower, even more preferably 10% by weight or lower.

A fullerene polymer film is obtained by producing a fullerene polymer in a film form. A fullerene polymer film is obtained preferably by the pyrolysis of a fullerene derivative having a partial structure represented by any of partial structural formulae (1), (2), and (5), more preferably by the pyrolysis of a fullerene derivative including [60]fullerene having a partial structure represented by any of partial structural formulae (1), (2), and (5), even more preferably by the pyrolysis of a fullerene derivative including a [60]fullerene derivative having a partial structure represented by either of partial structural formulae (1) and (2). The fullerene derivatives having those partial structural formulae have a low pyrolysis temperature, and the pyrolysis products are rapidly removed through decomposition, vaporization, etc., whereby the fullerene derivatives are rapidly converted to a fullerene polymer. Consequently, a fullerene polymer can be easily obtained. Furthermore, by forming those fullerene derivatives into a film beforehand, a fullerene polymer film can be easily obtained.

EXAMPLES

Examples are explained below which were conducted in order to ascertain the effects and advantages of the invention. FIG. 1 is a graphic presentation showing the results of a TG-DTA examination of [60]fullerene and Compound 1, which is an aminated fullerene derivative (see the structural formula given below). FIG. 2(A) is a graphic presentation showing the results of a TG examination of Compounds 1 to 6 in air; and FIG. 2(B) is a graphic presentation showing the results of a TG examination of Compounds 1 to 6 in nitrogen. FIG. 3(A) to (C) are graphic presentations showing the results of an examination by X-ray diffractometry of coating films of Compounds 1, 2, and 3, respectively, the examination having been made before and after a heat treatment.

Compounds 1 to 6, which were used in the following Examples, are shown below by formulae.
Compound 1
Compound 2
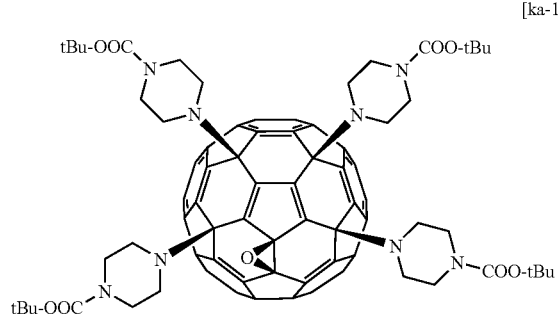
[ka-13]
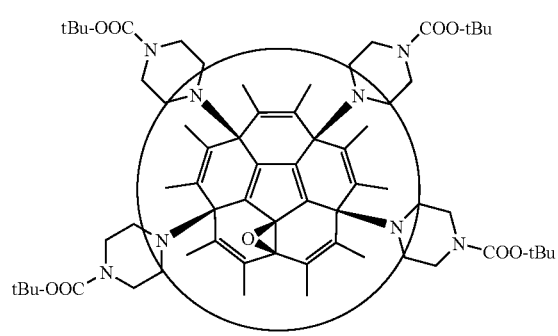
(Ellipse represents any desired fullerene)
Compound 3
Compound 4
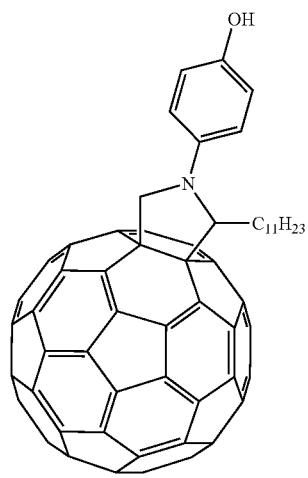
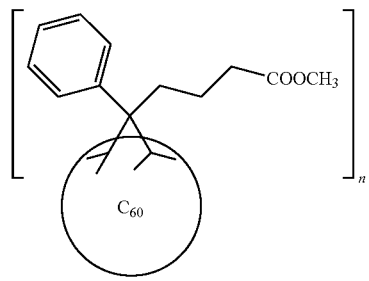
n = 2 or 3
Compound 5
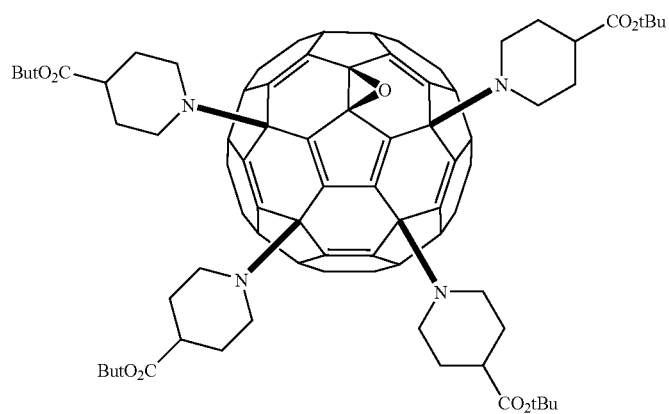
[ka-14]

Compound 6

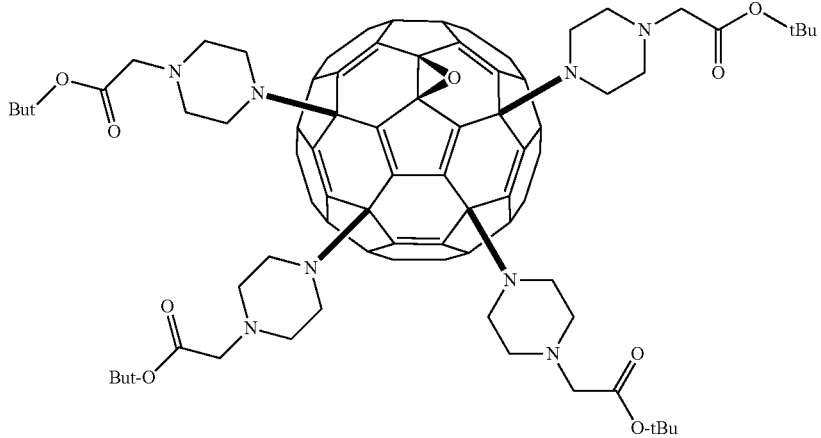

(1) Synthesis of Aminated [60]Fullerene Derivative (Compound 1)

Compound 1, which is a [60]fullerene derivative, was synthesized by the method described in a document (JP-A-2006-199674) by irradiating [60]fullerene and N-t-butoxycarbonylpiperazine with a light (60-W incandescent lamp) in chlorobenzene. Thereafter, the reaction mixture solution was directly loaded in a silica gel column and developed with toluene/ethyl acetate (49:1, v/v) to thereby purify the reaction product. $^1$H NMR (400 MHz, CDCl$_3$) δ: 1.49 (overlapped s, 18H, CH$_3$), 3.1-3.2 (br m, 8H, NCH$_2$CH$_2$), 3.2-3.3 (br m, 8H, NCH$_2$CH$_2$), 3.5-3.7 (br m, 16H, NCH$_2$). $^{13}$C NMR (100 MHz, CDCl$_3$) δ: 28.54 (2C, CH$_3$), 28.57 (2C, CH$_3$), 50.41 (4C, C$_{60}$NCH$_2$CH$_2$), 50.89 (4C, C$_{60}$NCH$_2$CH$_2$), 52.90 (C$_{60}$NCH$_2$), 63.08 (C$_{60}$NCH$_2$), 71.71 (1C, C—O), 71.83 (2C, C—N), 75.56 (2C, C—N), 76.37 (1C, C—O), 137.70 (10, C$_{60}$), 140.05 (2C, C$_{60}$), 141.65 (2C, C$_{60}$), 142.89 (2C, C$_{60}$), 143.12 (2C, C$_{60}$), 143.43 (2C, C$_{60}$), 143.52 (2C, C$_{60}$), 143.85 (2C, C$_{60}$), 143.94 (2C, C$_{60}$), 144.04 (2C, C$_{60}$), 144.38 (2C, C$_{60}$), 144.86 (2C, C$_{60}$), 145.18 (1C, C$_{60}$), 146.00 (2C, C$_{60}$), 146.24 (2C, C$_{60}$), 146.75 (2C, C$_{60}$), 146.87 (4C, C$_{60}$), 146.92 (2C, C$_{60}$), 147.04 (2C, C$_{60}$), 147.36 (2C, C$_{60}$), 147.64 (2C, C$_{60}$), 148.95 (2C, C$_{60}$), 149.07 (2C, C$_{60}$), 149.33 (4C, C$_{60}$), 151.12 (2C, C$_{60}$), 154.42 (2C, C$_{60}$), 154.56 (2C, C$_{60}$), 154.62 (2C, C$_{60}$). IR (neat, wavenumber/cm$^{-1}$) 3006 (w), 2975 (m), 2929 (w), 2856 (w), 2821 (w), 1698 (s), 1476 (w), 1453 (m), 1421 (s), 1365 (m), 1300 (w), 1286 (m), 1252 (s), 1171 (s), 1132 (s), 1001 (s), 862 (m), 755 (s), 699 (w), 665 (w), 581 (w), 547 (w), 536 (w), 505 (w). MS m/z (LC-APCI, toluene/i-PrOH=7/3) 1478 (MH$^+$). Compound 1 had a solubility in toluene of 15%.

(2) Synthesis of Aminated Fullerene Mixture Derivative (Compound 2)

An aminated fullerene mixture derivative (Compound 2) was synthesized in the same manner as for Compound 1, except that a fullerene mixture including [60]fullerene, [70] fullerene, and a higher-order fullerene in a proportion of 60:25:15 (mass %) was used as a starting material. Compound 2 had a solubility in toluene of 10% or higher.

(3) Synthesis of N-(4-hydroxyphenyl)-2-n-dodecylpyrrolidine-C$_{60}$ (Compound 3)

Into a three-necked flask equipped with a thermometer were introduced [60]fullerene and 1,2-dichlorobenzene. While the contents were being stirred in a nitrogen atmosphere, n-dodecanal and N-(4-hydroxyphenyl) glycine were added thereto. The resultant mixture was heated to 130° C. and stirred for 7 hours. This mixture was cooled to room temperature and then filtered to remove insoluble matters. The filtrate was concentrated. By silica gel column chromatography using toluene as an eluent, a fraction of a monoadduct was separated from the [60]fullerene remaining unreacted. The mono-adduct fraction was concentrated and then subjected to crystallization with toluene and methanol. The solid taken out was vacuum-dried at room temperature to thereby obtain Compound 3. The product obtained was identified by $^1$H NMR spectroscopy. $^1$H NMR (270 MHz, CDCl$_3$) δ: 7.28 (m, 2H), 6.98 (m, 2H), 5.31 (m, 1H), 5.13 (d, 1H), 5.02 (d, 1H), 4.59 (s, 1H), 2.61-2.27 (m, 2H), 1.70 (m, 2H), 1.40-1.20 (m, 16H), 0.87 (t, 3H). Compound 3 had a solubility in toluene of 6%.

(4) Synthesis of Compound 4

Compound 4 was synthesized with reference to the method described in a document (Jan C. Hummelen, Brian W. Knight, F. LePeq, Fred Wudl, *J. Org. Chem.*, 1995, 60, 532-538). The procedure was as follows. In a nitrogen atmosphere, methyl 4-benzoylbutyrate p-tosylhydrazone was dissolved in pyridine. Thereafter, sodium methoxide was added thereto, and this mixture was stirred for 15 minutes. Thereto was added [60]fullerene dissolved in 1,2-dichlorobenzene. The resultant mixture was reacted for 22 hours while keeping the liquid temperature at 65-70° C. Thereafter, the liquid reaction mixture was concentrated and purified with a silica gel column. The [60]fullerene remaining unreacted and a fraction of {6}-1-(3-(methoxycarbonyl)propyl)-{5}-1-phenyl[5,6]-C$_{61}$ a mono-adduct were recovered with 1,2-dichlorobenzene. Thereafter, Compound 4 was recovered with 1,2-dichlorobenzene and ethyl acetate. The solution obtained was concentrated and then vacuum-dried at 200° C. for 10 hours. Compound 4 had a solubility in toluene of 5%.

(5) Synthesis of Compound 5, i.e., C$_{60}$(tBu-isonipecotate)4 (O)

[Synthesis of Amine]

To isonipecotic acid (41.5 g; 320 mmol) was added 1,4-dioxane (200 mL). Thus, an inhomogeneous solution was obtained. Thereto was added 41.5 mL of concentrated sulfuric acid over 30 minutes. Into this inhomogeneous solution was bubbled 100 g of isobutene over 5 hours. After completion of the bubbling, the mixture was cooled to 0° C. and 750 mL of 2-N aqueous NaOH solution was added thereto. The resultant mixture was ascertained to be basic. Thereafter, a reaction product was extracted with 500 mL of diethyl ether, and the extract was dried with sodium sulfate and then concentrated to obtain 5.98 g of t-butyl isonipecotate as the target compound.

[Synthesis of Aminated Fullerene]

In an $N_2$ atmosphere, [60]fullerene (1.0 g; 1.39 mmol) was dissolved in chlorobenzene (200 mL) and the solution was stirred for 0.5 h. Thereafter, dimethyl sulfoxide (50 mL) was added thereto, and this mixture was stirred for 10 minutes. Thereto was added 80% cumene hydroperoxide (793 mg; 4.17 mmol) together with 1 mL of chlorobenzene. Thereafter, the t-butyl isonipecotate (2.57 g; 13.9 mmol) was added thereto together with 3 mL of chlorobenzene. The resultant mixture was stirred at room temperature. As a result, the starting-material [60]fullerene was ascertained to have disappeared at 7 hours thereafter. The organic phase was washed twice with ion-exchanged water (100 mL), subsequently washed with 0.5-N HCl (100 mL), and further washed twice with ion-exchanged water (100 mL). Sodium sulfate was added to the organic phase to dry the phase. The resultant mixture was filtered, and the filtrate was concentrated to about 5 mL. To the concentrate was added 150 mL of methanol with stirring. The precipitate obtained was taken out by filtration, washed with methanol, and then vacuum-dried at room temperature for 2 hours to thereby obtain 2.04 g of the target aminated fullerene (Compound 5) (yield, 99%). This product had an HPLC purity of 800. Compound 5 had a solubility in toluene of 10% or higher.

(6) Synthesis of Compound 6, i.e., $C_{60}$ (t-Butoxycarbonylmethylpiperazine)4(O)

[Synthesis of Amine]

Piperazine (8.0 g; 93 mmol) was dissolved in 80 mL of ethanol to obtain a homogeneous solution. Thereto was gradually added dropwise t-butyl bromoacetate (5.2 g; 27 mmol). After completion of the dropwise addition, the mixture was stirred for 23 hours. Ion-exchanged water (150 mL) was added thereto, and the resultant mixture was subjected to vacuum concentration without via any treatment. After the ethanol as a solvent was vaporized, ion-exchanged water (150 mL) was added to the residual aqueous solution. The resultant solution was ascertained not to be acidic. Thereafter, a reaction product was extracted with dichloromethane (300 mL). The resultant extract was dried with magnesium sulfate and then concentrated. Thus, 4.66 g of a mixture of t-butoxycarbonylmethylpiperazine as the target compound and di(t-butoxycarbonylmethyl)piperazine as a by-product was obtained.

[Synthesis of Aminated Fullerene]

In an $N_2$ atmosphere, [60]fullerene (1.0 g; 1.39 mmol) was dissolved in p-xylene (20 mL) and the solution was stirred for 10 minutes. Thereafter, dimethyl sulfoxide (5 mL) was added thereto, and this mixture was stirred for 1 hour. The t-butoxycarbonylmethylpiperazine (2.3 g; 11.1 mmol as calculated from the proportion thereof because this compound was used as the mixture) was added thereto together with 5 mL of p-xylene. Thereto was then added 84% cumenehydroperoxide (880 mg; 4.86 mmol) together with 5 mL of p-xylene. The resultant mixture was stirred at room temperature. As a result, the starting-material [60]fullerene was ascertained to have disappeared at 47 hours thereafter. To this mixture was added p-xylene (100 mL). The organic phase was washed once with a liquid mixture of ion-exchanged water (100 mL) and acetonitrile (20 mL), subsequently washed with a liquid mixture of 0.5-N HCl (100 mL) and acetonitrile (20 mL), and further washed once with a liquid mixture of ion-exchanged water (100 mL) and acetonitrile (20 mL). Sodium sulfate was added to the organic phase to dry the phase. The resultant mixture was filtered, and the filtrate was concentrated to about 5 mL. To the concentrate was added 200 mL of acetonitrile with stirring. The precipitate obtained was taken out by filtration, washed with acetonitrile, and then vacuum-dried at room temperature for 3 hours to thereby obtain 2.02 g of the target aminated fullerene (Compound 6) (yield, 95%). This product had an HPLC purity of 46%. Compound 6 had a solubility in toluene of 10% or higher.

The solubility of a fullerene derivative can be determined, for example, by diluting a solution of the fullerene derivative with a good solvent, e.g., toluene, and examining the dilution with an analyzer such as, e.g., a high-performance liquid chromatograph (HPLC). More specifically, the procedure is as follows. A dilution of the fullerene derivative solution is analyzed with an HPLC having an ultraviolet/visible detector to determine that peak intensity for the fullerene derivative which is obtained from the absorbance of an ultraviolet light having a specific wavelength (e.g., 290 nm). The concentration of the fullerene derivative in the dilution of the fullerene derivative solution is determined from a calibration curve obtained beforehand from fullerene derivative standard solutions having known concentrations (prepared using the solvent used for diluting the fullerene derivative solution). This concentration value is multiplied by the dilution ratio to thereby determine the fullerene derivative concentration in the original fullerene derivative solution.

(7) Thermal Analysis of Compounds 1 to 6

Compounds 1 to 6 synthesized in (1) to (6) above were examined by TG-DTA (thermogravimetric-differential thermal analysis) in order to investigate the behavior thereof in thermal decomposition. The examination was made with apparatus for both differential thermal analysis and thermogravimetry TG/DTA6200, manufactured by SII Nano Technology Inc., in an air atmosphere (flow rate, 200 mL/min) under the conditions of a heating rate of 10° C./min. The results of the examination of [60]fullerene and Compound 1 are shown in FIG. 1. In [60]fullerene, a large weight loss accompanied by heat generation began to be observed at around 500° C. This weight loss was due to oxidation/combustion. In Compound 1, a slight increase in exotherm and a large weight loss which were not seen in [60]fullerene were observed at around 200° C. This large weight loss is thought to be attributable to the pyrolysis of the fullerene derivative.

Furthermore, a large exothermic peak was observed at around 500° C. This peak is thought to be attributable to the oxidation/combustion of the spherical structure of the fullerene, as in the case of [60]fullerene.

The results of the TG examination of Compounds 1 to 6 in air are shown in FIG. 2(A). It can be seen that all of Compound 1, which is a derivative of [60]fullerene, Compound 2, which is a derivative of a fullerene mixture, Compound 5, and Compound 6 undergo pyrolysis at almost the same temperature around 200° C. Compounds 3 and 4 also were subjected to a TG examination under the same conditions. However, a weight loss attributable to the pyrolysis of the fullerene derivatives was unable to be clearly distinguished from oxidation/combustion. No weight loss attributable to fullerene derivative pyrolysis was observed.

Compounds 1 to 6 were hence subjected to a TG examination in a nitrogen atmosphere. The examination was made with apparatus for both differential thermal analysis and thermogravimetry TG/DTA6200, manufactured by SII Nano Technology Inc., in a nitrogen atmosphere (flow rate, 200 mL/min) under the conditions of a heating rate of 10° C./min. The results obtained are shown in FIG. 2(B). It can be seen that all of Compounds 1, 2, 5, and 6 underwent a weight loss attributable to pyrolysis at almost the same temperature as in air. This shows that the pyrolysis of Compounds 1 and 2 at around 200° C. was not attributable to oxidation by air.

With respect to Compounds 3 and 4 also, a weight change attributable to pyrolysis was observed at around 300-500° C. In the region of temperatures not lower than 500° C., a plateau was observed. It is therefore thought that the weight change was attributable not to fullerene sublimation but to the pyrolysis of the fullerene derivatives.

The results given above show that Compounds 1, 2, 5, and 6, which are aminated fullerene derivatives, decompose in the air and in air at a temperature lower than the pyrolysis temperature of the fullerene, while Compounds 3 and 4 decompose in nitrogen (in inert atmosphere) at a temperature lower than the pyrolysis temperature of the fullerene. All these compounds thus yield a fullerene film.

In Table 1 are shown the weight losses of the respective compounds determined from the values obtained in the TG-DTA examinations.

TABLE 1

|  | 300° C. (in air) | 300° C. (in nitrogen) |
|---|---|---|
| Compound 1 | 41% | 48% |
| Compound 2 | 41% | 41% |
| Compound 5 | 37% | 44% |
| Compound 6 | 38% | 50% |

|  | 600° C. (in nitrogen) |
|---|---|
| Compound 3 | 12% |
| Compound 4 | 9% |

(8) Formation of Coating Films

A 5% by mass PGMEA solution of each of Compounds 1, 2, and 5 and a 5% by mass cyclohexanone solution of each of Compounds 3 and 4 were prepared. Each solution was applied to a glass substrate (50×50 mm) with a spin coater and dried at 100° C. Thereafter, the coating films were examined with an optical microscope. As a result, these coating films were ascertained to be even. These coating films were washed with toluene. As a result, the films were removed. It was thus ascertained that the coating films from which the solvent had been removed were soluble in toluene.

With respect to Compound 2, a 20% by mass PGMEA solution thereof was prepared and applied to a glass substrate (50×50 mm) with a spin coater. The thickness of the resultant film was measured with a stylus type surface roughness meter. As a result, the thickness of the coating film was found to be 14 μm. It was found that this process can form an exceedingly thick film as compared with film formation techniques based on vapor deposition or the like.

Incidentally, a 0.1% by mass toluene solution of [60]fullerene was used in an attempt to form a coating film on a glass substrate under the same conditions. However, an even coating film was unable to be obtained.

(9) Heating Test

The coating films of Compounds 1 to 5 each formed on a glass substrate in (8) were placed in an electric furnace heated at 300° C. and heat-treated for 10 minutes in an air atmosphere.

The fullerene films obtained by the heat treatment of the coating films of Compounds 1 to 3 were examined by X-ray diffractometry (XRD) with RINT 2500, manufactured by Rigaku Corp. Furthermore, the coating film of Compound 3 was placed in an electric furnace heated at 500° C. and heat-treated for 10 minutes in a nitrogen atmosphere. Measuring conditions are as follows.

Radiation source: CuK$_\alpha$
Output: 40 kV/200 mA
Operating axis: 2θ/θ
Examination mode: Continuous
Examination range: 3-50°
Step axis: 0.05°

Graphs showing the results of the examination by X-ray diffractometry of the coating films of Compounds 1, 2, and 3 which was conducted before and after the heat treatment(s) are shown in FIG. 3(A), FIG. 3(B), and FIG. 3(C), respectively. In the coating film of each of Compounds 1 and 2 which had undergone the heat treatment, peaks characteristic of [60]fullerene were observed at 2θs of around 10°, around 17°, and around 20° unlike the coating film which had not undergone the heat treatment.

With respect to the coating film of Compound 3 also, the same results as for the coating films of Compounds 1 and 2 were obtained.

It was ascertained from the results given above that the spherical closed-shell structure of the fullerene was maintained in the products of the pyrolysis of Compounds 1 to 3.

With respect to Compounds 1 to 5, the coating films were subjected to elemental analysis before and after the heat treatment(s). Each coating film was scraped off the glass substrate to which the solution had been applied, and subjected to the elemental analysis. The results of the elemental analysis are shown in Table 2. In the table, "wt %" means % by mass.

TABLE 2

|  |  | wt % | | | | Solubility |
|---|---|---|---|---|---|---|
|  |  | C | H | N | O | in toluene |
| Compound 1 | Before heat treatment | 76.4% | 4.9% | 7.7% | 13.2% | soluble |
|  | After heat treatment (300° C./in air) | 93.8% | 0.7% | 2.0% | 3.8% | insoluble |
| Compound 2 | Before heat treatment | 77.6% | 4.7% | 7.0% | 12.3% | soluble |
|  | After heat treatment (300° C./in air) | 90.2% | 0.4% | 3.2% | 5.7% | insoluble |
| Compound 3 | Before heat treatment | 93.9% | 2.9% | 1.5% | 2.4% | soluble |
|  | After heat treatment (300° C./in air) | 93.6% | 2.7% | 1.4% | 2.5% | soluble |
|  | After heat treatment (500° C./in air) | 96.3% | 1.3% | 0.7% | 1.4% | insoluble |
| Compound 4 | Before heat treatment | 91.4% | 2.1% | — | 6.7% | soluble |
|  | After heat treatment (300° C./in air) | 91.5% | 2.2% | — | 6.6% | soluble |
|  | After heat treatment (500° C./in air) | 97.2% | 1.2% | — | 1.3% | insoluble |

TABLE 2-continued

|  |  | wt % | | | | Solubility |
|---|---|---|---|---|---|---|
|  |  | C | H | N | O | in toluene |
| Compound 5 | Before heat treatment | 81.4% | 4.6% | 3.3% | 11.7% | soluble |
|  | After heat treatment (300° C./in air) | 93.8% | 0.7% | 2.0% | 3.8% | insoluble |

The elemental analysis was conducted under the following conditions.

The following were used for the analysis.

CHN analysis: CHN analyzer PE2400II, manufactured by PERKIN ELMER INC.

O analysis: oxygen/nitrogen analyzer TC-436, manufactured by LECO Corp.

In Compounds 1 and 2, the results of the elemental analysis show that the content of hydrogen, oxygen, and nitrogen, which are derived from the substituents of the fullerene derivatives, decreased and the content of carbon remarkably increased through the heat treatment in air. It is therefore thought that the pyrolysis of the fullerene derivatives proceeded due to the heat treatment. On the other hand, with respect to Compounds 3 and 4, no significant change in the values of elemental analysis for the coating films was observed through the 10-minute heat treatment with 300° C. air. However, the results of the elemental analysis of the coating films which had undergone the 10-minute heat treatment with 500° C. nitrogen show that pyrolysis had occurred. It can be seen from these results that Compounds 3 and 4 undergo the pyrolysis of the fullerene derivatives when heat-treated in an inert atmosphere. These results almost coincide with the results of elemental analysis obtained in an examination in which those fullerene derivatives alone were pyrolyzed, without being applied to form a film, and then subjected to elemental analysis. It is therefore thought that the same pyrolysis reaction as the pyrolysis behavior shown by the graphs in FIG. 2 had occurred.

The films which had undergone the heat treatment(s) were washed with toluene. As a result, the films did not dissolve and remained on the substrates. It can be seen that although the fullerene derivatives applied in film form had been soluble in toluene solvent, the derivatives became insoluble, through the heat treatment(s), in the solvent in which the fullerene is soluble.

The results of the analysis of the resultant fullerene films by XRD and TG-DTA suggest that the films had the closed-shell structure of the fullerene. It is therefore thought that since the fullerene films had become insoluble in the solvent while retaining the closed-shell structure of the fullerene due to a pyrolysis reaction caused by the heat treatment(s), the fullerene films obtained by pyrolyzing the fullerene derivatives were fullerene polymer films constituted of a fullerene polymer.

Furthermore, the results of the elemental analysis show that oxygen atoms were contained in the fullerene films obtained by the pyrolysis of fullerene derivatives (Compounds 1 to 5), and that nitrogen atoms were contained in the fullerene films obtained by the pyrolysis of fullerene derivatives (Compounds 1 to 3 and 5). It is therefore thought that the fullerene polymers and fullerene films obtained from these fullerene derivatives contained nitrogen atoms in the structures thereof and the films obtained were nitrogen-containing fullerene polymer films.

The properties of such fullerene films are equal to those of ordinary fullerene films derived from fullerenes. Consequently, the fullerene polymers produced above, which contain nitrogen in the structures thereof, are novel fullerene polymers. These polymers can be expected to be utilized as fullerene films highly rich in processability.

The invention should not be construed as being limited to the embodiments described above, and can be modified unless the modifications depart from the spirit of the invention. For example, part or all of the embodiments and modification examples shown above may be combined to constitute the fullerene film and fullerene polymer of the invention and constitute processes for producing these. This case also is included in the scope of the claims of the invention.

For example, in the embodiments of the process for fullerene film production described above, the solvent removal from the fullerene derivative coating film and the heat treatment for pyrolysis may be simultaneously conducted.

While the invention has been described in detail and with reference to specific embodiments thereof, it will be apparent to one skilled in the art that various changes and modifications can be made therein without departing from the spirit and scope thereof.

This application is based on a Japanese patent application filed on Dec. 27, 2006 (Application No. 2006-351751), the contents thereof being herein incorporated by reference.

INDUSTRIAL APPLICABILITY

The fullerene films obtained can be utilized as functional thin films such as organic-semiconductor thin films and photoconductive films, thin films for batteries, and lubricating films for sliding surfaces.

[Solar Cell Applications]

The fullerene polymer is applicable also to organic solar cells. Solar cells employing a fullerene derivative as a photoelectric converting element have many advantages over silicon-based inorganic solar cells. However, the former solar cells have a low energy conversion efficiency and have not sufficiently reached a practical level. A bulk heterojunction type organic solar cell has recently been proposed as an organic solar cell which overcomes that problem. This solar cell has an active layer constituted of a mixture of an electroconductive polymer as an electron donor and a fullerene and fullerene derivative as an electron acceptor. In this bulk heterojunction type organic solar cell, the electroconductive polymer and the fullerene derivative have mingled with each other on molecular level. As a result, this technique has succeeded in creating an exceedingly large interface and attained a great improvement in conversion efficiency.

In such bulk heterojunction type organic solar cells, a contrivance has been made in which a functional group is introduced to a fullerene to increase solubility in order to enhance interaction with the electroconductive polymer.

However, it is known that increasing the number of functional groups to be introduced to a fullerene usually results in a large deformation of the fullerene framework and too high an LUMO energy level and this results in a reduced electron affinity and completely no photo-electric converting ability.

When the fullerene polymer according to the invention is used, a fullerene derivative which has not been pyrolyzed and is in the state of having exceedingly high solubility can be mixed with an electroconductive polymer. Consequently, an efficient bulk heterojunction structure can be easily constituted. Furthermore, the fullerene polymer film obtained through pyrolysis intrinsically retains the n-type semiconductor properties of the fullerene because the substituents which were bonded have been eliminated or decomposed. Because of these, an exceedingly high-performance organic solar cell can be realized by using the fullerene polymer of the invention.

It has been suggested that by introducing nitrogen into a material such as graphite so that the nitrogen substitutes the material or forms a solid solution therein, excess electrons are localized to enable the material to function as an acceptor (Michio Inagaki, Kaisetsu, Kābon Famiri). The fullerene polymer film of the invention which contains nitrogen in the structure thereof is also expected to produce the same effect. It is expected that acceptor ability in an organic solar cell is enhanced. By using the fullerene polymer of the invention, an exceedingly high-performance organic solar cell can be realized.

[Semiconductor Applications]

Investigations are being made on the use of fullerenes and fullerene derivatives as an organic material for field effect transistors, which can be expected to be applied to optical sensors, rectifier, etc. It is generally known that when a fullerene and a fullerene derivative are used as a semiconductor to produce a field effect transistor, this field effect transistor functions as an n-type transistor. Use of the fullerene polymer according to the invention has the following advantages. Since the fullerene derivative which has not been pyrolyzed has exceedingly high solubility in organic solvents for use in that application, film formation by coating fluid application is easy. Furthermore, the fullerene polymer film obtained through pyrolysis intrinsically retains the n-type semiconductor properties of the fullerene because the substituents which were bonded have been eliminated or decomposed. Because of this, the fullerene polymer film of the invention can be expected to be used as a low-cost high-performance organic semiconductor.

The invention claimed is:

1. A process for producing a fullerene polymer film on a substrate, comprising:

applying to a substrate a solution of a fullerene derivative having at least one partial structure represented by formula (1) and (2) on a fullerene framework:

[Ka-2]

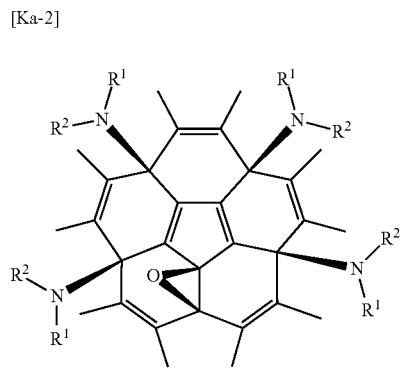

(1)

[Ka-1]

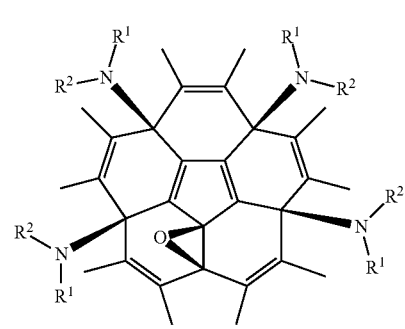

(1)

-continued

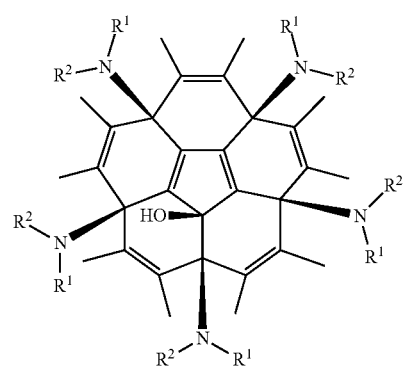

(2)

wherein $R^1$ and $R^2$ each, independently, represents a hydrocarbon group which may have any desired substituent, and $R^1$ and $R^2$, in combination with any of a carbon atom, nitrogen atom, and oxygen atom bonded to both of $R^1$ and $R^2$, may form a nitrogen-containing ring which may have any desired substituent; and pyrolyzing the fullerene derivative at a temperature which is higher than a pyrolysis temperature of the fullerene derivative and is lower than a pyrolysis temperature of a fullerene to form a fullerene polymer film on a substrate.

2. The process according to claim 1, wherein the fullerene derivative has a pyrolysis temperature of from 100° C. to 500° C.

3. The process according to claim 1, wherein the fullerene derivative has the partial structure represented by formula (1).

4. The process according to claim 1, wherein the fullerene derivative has the partial structure represented by formula (2).

5. A process for producing a fullerene polymer in solution, comprising:

pyrolyzing a solution of a fullerene derivative having at least one partial structure represented by formula (1) and (2) on a fullerene framework at a temperature which is higher than a pyrolysis temperature of the fullerene derivative and lower than a pyrolysis temperature of the fullerene polymer:

-continued (2)

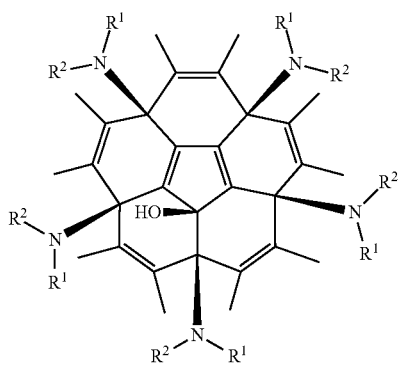

wherein R¹ and R² each, independently, represent a hydrocarbon group which may have any desired substituent, and R¹ and R², in combination with any of a carbon atom, nitrogen atom, and oxygen atom bonded to both of R¹ and R², may form a nitrogen-containing ring which may have any desired substituent, to form a fullerene polymer in the solution.

6. The process according to claim 5, wherein the fullerene derivative has a pyrolysis temperature of from 100° C. to 500° C.

7. The process according to claim 5, wherein the fullerene derivative has the partial structure represented by formula (1).

8. The process according to claim 5, wherein the fullerene derivative has the partial structure represented by formula (2).

9. A process for producing a fullerene film, which comprises:

pyrolyzing a solution of a fullerene derivative on a substrate at a temperature which is higher than the pyrolysis temperature of the fullerene derivative and lower than a pyrolysis temperature of the fullerene, wherein the fullerene derivative has either of partial structures respectively represented by the following general formulae (1) and (2) on a fullerene framework:

[Ka-3]

(1)

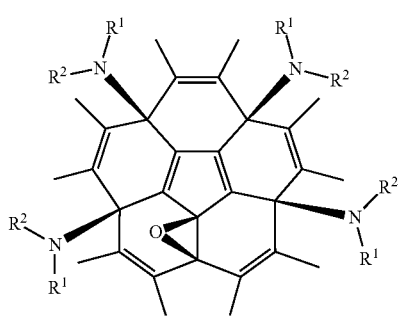

-continued (2)

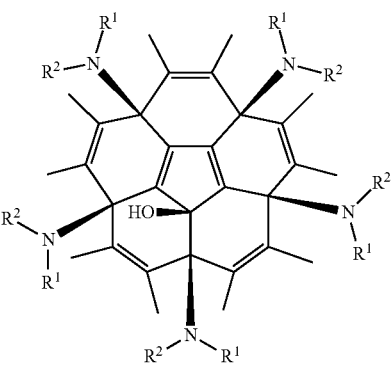

wherein in general formulae (1) and (2), R¹ and R² each independently represent a hydrocarbon group which may have any desired substituent, and R¹ and R², in cooperation with any of a carbon atom, nitrogen atom, and oxygen atom bonded to both of R¹ and R², may form a nitrogen-containing ring which may have any desired substituent.

10. The process according to claim 9, wherein the fullerene derivative has a pyrolysis temperature of from 100° C. to 500° C.

11. The process according to claim 9, wherein the fullerene derivative has the partial structure represented by formula (1).

12. The process according to claim 9, wherein the fullerene derivative has the partial structure represented by formula (2).

13. A process for producing a nitrogen-containing or oxygen-containing fullerene film, which comprises:

applying to a substrate a solution of a fullerene derivative to obtain a coating film; and heating the coating film obtained at a temperature which is higher than a pyrolysis temperature of the fullerene derivative and is lower than the pyrolysis temperature of the fullerene to thereby pyrolyze at least part of the fullerene derivative, wherein the fullerene derivative has either of partial structures respectively represented by the following general formulae (1) and (2) on a fullerene framework:

[Ka-4]

(1)

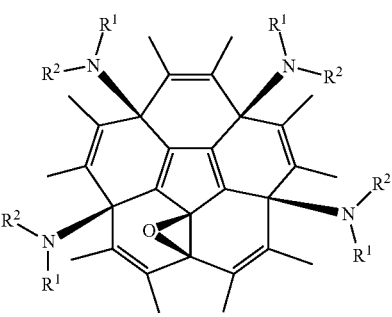

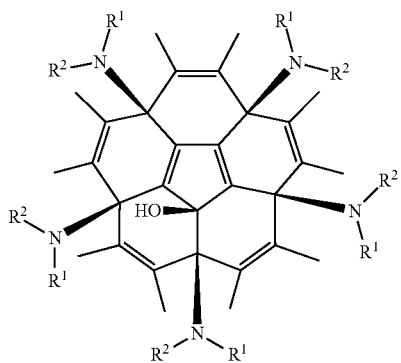

(2)

wherein in general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

14. The process according to claim 13, wherein the fullerene derivative has a pyrolysis temperature of from 100° C. to 500° C.

15. The process according to claim 13, wherein the fullerene derivative has the partial structure represented by formula (1).

16. The process according to claim 13, wherein the fullerene derivative has the partial structure represented by formula (2).

17. A process for producing a nitrogen-containing or oxygen-containing fullerene film, which comprises:
applying to a substrate a solution of a fullerene derivative to obtain a coating film; and heating the coating film obtained at a temperature which is higher than a pyrolysis temperature of the fullerene derivative and is lower than the pyrolysis temperature of the fullerene to thereby pyrolyze at least part of the fullerene derivative,
wherein the fullerene derivative comprises a mixture of a fullerene derivative having a partial structure represented by the general formula (1) on a fullerene framework and a fullerene derivative having a partial structure represented by the general formula (2) on a fullerene framework:

[Ka-5]

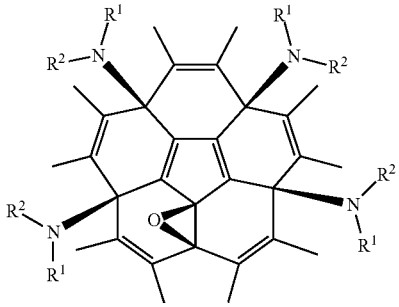

(1)

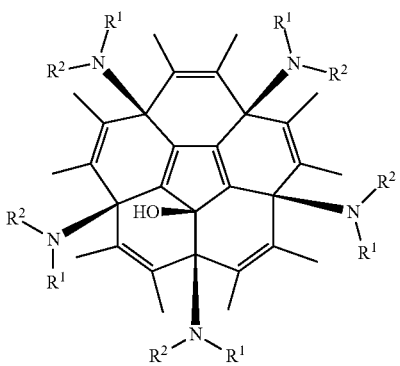

(2)

wherein in general formulae (1) and (2), $R^1$ and $R^2$ each independently represent a hydrocarbon group which may have any desired substituent, and $R^1$ and $R^2$, in cooperation with any of a carbon atom, nitrogen atom, and oxygen atom bonded to both of $R^1$ and $R^2$, may form a nitrogen-containing ring which may have any desired substituent.

18. The process according to claim 17, wherein the fullerene derivative has a pyrolysis temperature of from 100° C. to 500° C.

* * * * *

UNITED STATES PATENT AND TRADEMARK OFFICE
CERTIFICATE OF CORRECTION

| | |
|---|---|
| PATENT NO. | : 8,268,402 B2 |
| APPLICATION NO. | : 12/521630 |
| DATED | : September 18, 2012 |
| INVENTOR(S) | : Katsutomo Tanaka et al. |

It is certified that error appears in the above-identified patent and that said Letters Patent is hereby corrected as shown below:

In the Claims

In Column 36, Line 47:
--fullerene polymer:-- should read "fullerene:"

Signed and Sealed this
Eighteenth Day of November, 2014

Michelle K. Lee
*Deputy Director of the United States Patent and Trademark Office*